(12) United States Patent
Isoda

(10) Patent No.: US 7,843,227 B2
(45) Date of Patent: Nov. 30, 2010

(54) SEMICONDUCTOR INTEGRATED CIRCUIT

(75) Inventor: Masanori Isoda, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 12/331,051

(22) Filed: Dec. 9, 2008

(65) Prior Publication Data

US 2009/0146693 A1      Jun. 11, 2009

(30) Foreign Application Priority Data

Dec. 10, 2007   (JP)   ............... 2007-317961

(51) Int. Cl.
*H01L 25/00*   (2006.01)
*H03K 19/00*   (2006.01)
(52) U.S. Cl. ............... 326/103; 257/208; 257/371; 331/57
(58) Field of Classification Search ......... 326/104–108, 326/112, 119, 121, 122, 125; 716/8–17; 257/202–211, 369, 371
See application file for complete search history.

(56) References Cited

U.S. PATENT DOCUMENTS

2007/0063288 A1* 3/2007 Furuta et al. ............... 257/369
2008/0142898 A1* 6/2008 Watanabe et al. .......... 257/369

FOREIGN PATENT DOCUMENTS

JP    2003-309178 A    10/2003
JP    2004-319855 A    11/2004

* cited by examiner

*Primary Examiner*—Rexford N Barnie
*Assistant Examiner*—Jany Tran
(74) *Attorney, Agent, or Firm*—Miles & Stockbridge P.C.

(57) ABSTRACT

The present invention is directed to reduce the chip area of a semiconductor integrated circuit. A semiconductor integrated circuit of the invention includes a first transistor, a second transistor disposed adjacent to the first transistor along a Y axis, and a third transistor disposed adjacent to the second transistor along an X axis. The semiconductor integrated circuit further includes a fourth transistor disposed adjacent to the third transistor along the Y axis and disposed adjacent to the first transistor along the X axis. The first to fourth transistors share a well, and an output signal of the first transistor and an output signal of the second transistor have phases opposite to each other. An output signal of the second transistor and an output signal of the third transistor have phases opposite to each other. An output of the third transistor and an output signal of the fourth transistor have phases opposite to each other. The outputs of the transistors act so as to cancel out fluctuations in well potential.

12 Claims, 34 Drawing Sheets

US 7,843,227 B2

SEMICONDUCTOR INTEGRATED CIRCUIT

CROSS-REFERENCE TO RELATED APPLICATIONS

The disclosure of Japanese Patent Application No. 2007-317961 filed on Dec. 10, 2007 including the specification, drawings and abstract is incorporated herein by reference in its entirety.

BACKGROUND OF THE INVENTION

The present invention relates to the technique for reducing fluctuations in well potential in a semiconductor integrated circuit.

A technique is known, which sets potential in a substrate or a well region (called "well potential") to power source potential or a different potential in order to control the threshold value of a MOS (Metal Oxide Semiconductor) transistor. Supply of a potential to a well region will be called "well power feed". The well power feed is performed via a dedicated tap. As examples of documents describing such well power feed, Japanese Unexamined Patent Publication No. 2003-309178 (patent document 1) and Japanese Unexamined Patent Publication No. 2004-319855 (patent document 2) can be mentioned.

Patent document 1 describes a technique for disposing reinforcement power feed cells for performing reinforcement power feed between cells at the time of performing layout by disposing a plurality of cells in series. Each of the cells has an impurity diffusion region for supplying a substrate or well potential different from the power source potential. The reinforcement power feed cell includes an impurity diffusion region to be electrically coupled to an impurity diffusion region in an adjacent cell, and a power feed line provided in a wiring layer formed over the impurity diffusion region and electrically coupled to the impurity diffusion region. A source diffusion region is coupled to a line in a power source wiring layer via a contact.

Patent document 2 describes a layout method realizing high-density integration by reducing the number of taps by determining the proper number of taps for well power feed.

SUMMARY OF THE INVENTION

The inventors of the present invention have examined the conventional layout techniques in semiconductor integrated circuits and found the following problems.

When a tap for feeding power to the well region is provided for each of the cells, the chip area of the semiconductor integrated circuit enlarges. To reduce the chip area of the semiconductor integrated circuit, the smaller number of taps is advantageous. However, when the number of taps is reduced, the tap interval inevitably increases, the well resistance in the intervals becomes higher, and well noise (fluctuations in the well potential) tends to increase. The well noise causes erroneous operation of the circuit and, further, chip destruction due to latch-up. Therefore, in the case of decreasing the number of taps, it is necessary to prevent the well noise from exceeding a permissible range.

An object of the present invention is to reduce the well noise.

The above and other objects and novel features of the present invention will become apparent from the description of the specification and the appended drawings.

A representative one of inventions disclosed in the application will be briefly described as follows.

A semiconductor integrated circuit of the invention includes a first transistor, a second transistor disposed adjacent to the first transistor along a Y axis, a third transistor disposed adjacent to the second transistor along an X axis, and a fourth transistor disposed adjacent to the third transistor along the Y axis and disposed adjacent to the first transistor along the X axis. The first to fourth transistors share a well, and an output signal of the first transistor and an output signal of the second transistor have phases opposite to each other. An output signal of the second transistor and an output signal of the third transistor have phases opposite to each other. An output signal of the third transistor and an output signal of the fourth transistor have phases opposite to each other. The outputs of the transistors act so as to cancel out fluctuations in well potential. As a result, reduction in well noise is achieved.

Effects obtained by typical aspects of the invention disclosed in the present application are outlined below.

That is, well noise can be reduced.

DETAILED DESCRIPTION OF THE PREFERRED EMBODIMENTS

1. Representative Embodiments

Figure 1:
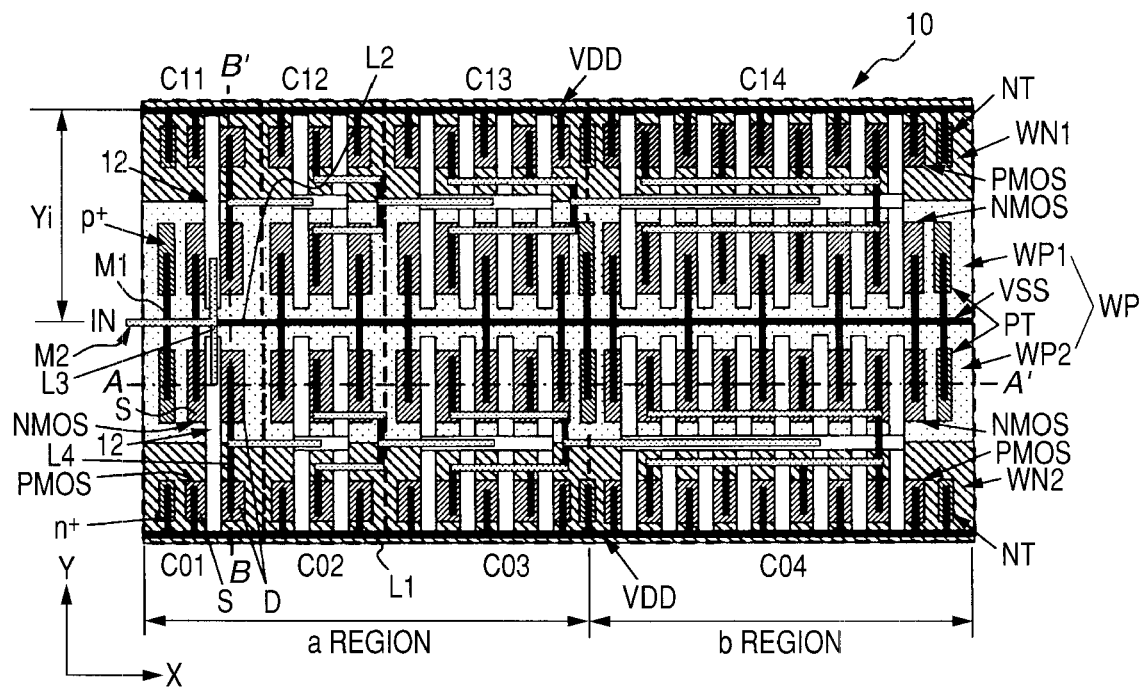
FIG. 1 is a plan view showing an example of layout of a semiconductor integrated circuit according to the present invention.

First, outline of representative embodiments of the present invention disclosed in the application will be described. Reference numerals of the drawings which are referred to, in parenthesis in the outline explanation of the representative embodiments merely indicate members included in the concept of components to which the reference numerals are given.

(1) A semiconductor integrated circuit (10) in a representative embodiment of the present invention includes: a first transistor (Tr2); a second transistor (Tr3) disposed adjacent to the first transistor along the Y axis; a third transistor (Tr6) disposed adjacent to the second transistor along the X axis orthogonal to the Y axis; and a fourth transistor (Tr7) disposed adjacent to the third transistor along the Y axis and disposed adjacent to the first transistor along the X axis. The first to fourth transistors share a well, an output signal of the first transistor and an output signal of the second transistor have phases opposite to each other, an output signal of the second transistor and an output signal of the third transistor have phases opposite to each other, and an output of the third transistor and an output signal of the fourth transistor have phases opposite to each other.

With the configuration, in the case where the well is shared and output signals of the transistors disposed adjacent to each other have opposite phases, outputs of the transistors act so as to cancel out the well potential fluctuations. Thus, the well noise can be reduced.

(2) Another semiconductor integrated circuit (10) in a representative embodiment of the invention includes: a first transistor (Tr2); a second transistor (Tr7) disposed adjacent to the first transistor along the X axis; a third transistor (Tr6) disposed adjacent to the second transistor along the Y axis orthogonal to the X axis; and a fourth transistor (Tr3) disposed adjacent to the third transistor along the X axis and disposed adjacent to the first transistor along the Y axis. The first to fourth transistors share a well, an output signal of the first transistor and an output signal of the second transistor have phases opposite to each other, an output signal of the second transistor and an output signal of the third transistor have phases opposite to each other, and an output of the third transistor and an output signal of the fourth transistor have phases opposite to each other.

With the configuration, in the case where the well is and output signals of the transistors disposed adjacent to each other have opposite phases, outputs of the transistors act so as to cancel out the well potential fluctuations. Thus, the well noise can be reduced.

(3) A first logic circuit is formed by including the first transistor, a second logic circuit is formed by including the second transistor, a third logic circuit is formed by including the third transistor, and a fourth logic circuit is formed by including the fourth transistor. It can be constructed so that an output signal of the first logic circuit is transmitted to the second logic circuit, an output signal of the second logic circuit is transmitted to the third logic circuit, and an output signal of the third logic circuit is transmitted to the fourth logic circuit.

(4) Feed taps (PT and NT) for feeding power to the well, formed by an active region in the surface of a well of the same conduction type as that of the well are provided. The feed taps can be disposed every plural transistors so as to surround the plural transistors.

(5) A plurality of logic circuit groups each including the first, second, third, and fourth logic circuits can be disposed along the X axis.

(6) The feed taps can be disposed in a border of the plural logic circuit groups.

(7) The first, second, third, and fourth logic circuits can take form of inverters (C01 to C04, C11 to C14) each including a p-channel-type MOS transistor and an n-channel-type MOS transistor coupled in series with the p-channel-type MOS transistor.

(8) Logic circuits (C01 to C04, C11 to C14) belonging to different logic circuit groups can be disposed adjacent to each other along the X axis or the Y axis.

(9) The first, third, and fourth logic circuits can take the form of inverters (C01, C03, and C04) for inverting logic of an input signal and outputting the resultant signal, and the second logic circuit can take the form of a NOR gate (NR01) for obtaining NOR logic of an input signal.

(10) The first, third, and fourth logic circuits can take the form of inverters (C01, C03, and C04) for inverting logic of an input signal and outputting the resultant signal, and the second logic circuit can take the form of a NAND gate (ND01) for obtaining NAND logic of an input signal.

(11) A logic circuit for outputting a signal having a relation of a correlation level with an output signal of the fourth logic circuit can be disposed adjacent to the fourth logic circuit. In such a manner, well noise can be reduced.

(12) The first and second logic circuits can take the form of inverters (I11 and I12) for inverting logic of an input signal and outputting the resultant signal, the third logic circuit can take the form of a NAND gate (ND01) for obtaining NAND logic of an input signal, the fourth logic circuit can take the form of a NOR gate (NR01) for obtaining NOR logic of an input signal. The fifth and sixth logic circuits are disposed adjacent to the fourth logic circuit along the Y axis, the sixth logic circuit is disposed adjacent to the fifth logic circuit along the X axis, and an output signal of the fifth logic circuit and an output signal of the sixth logic circuit have phases opposite to each other. In such a manner, well noise can be reduced.

(13) When the semiconductor integrated circuit has a first logic circuit including the first transistor, a second logic circuit including the second transistor, a third logic circuit including the third transistor, and a fourth logic circuit including the fourth transistor, a signal input to the first and third logic circuits and a signal input to the second and fourth logic circuits are set at a complementary level. In such a manner, well noise can be reduced.

(14) By coupling a plurality of logic circuits including the first, second, third, and fourth logic circuits in a loop shape, a ring oscillator can be formed.

2. Description of Embodiments

First Embodiment

Next, modes for carrying out the present invention will be described in more detail.

As a rule, in all of the drawings for explaining embodiments, the same reference numeral is designated to the same member.

Figure 2:
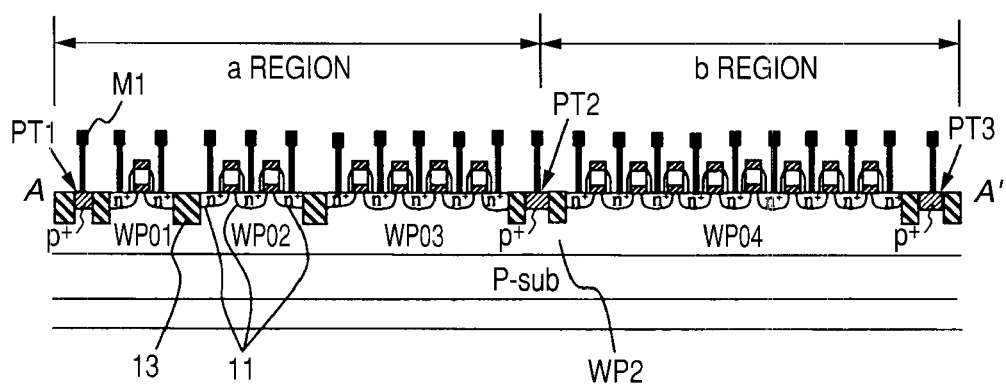
FIG. 2 is a cross section taken along line A-A' of FIG. 1.
Figure 3:
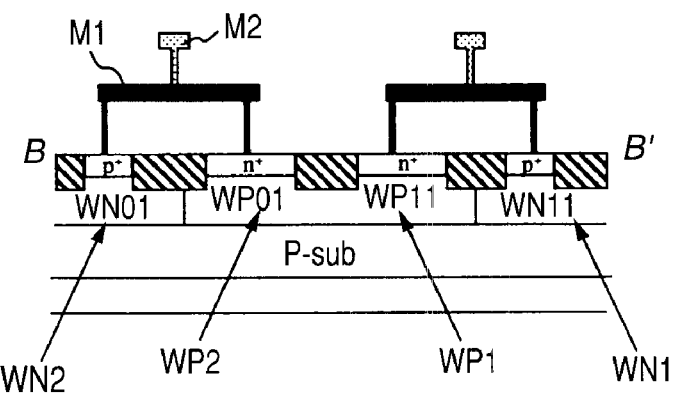
FIG. 3 is a cross section taken along line B-B' of FIG. 1.
Figure 4:
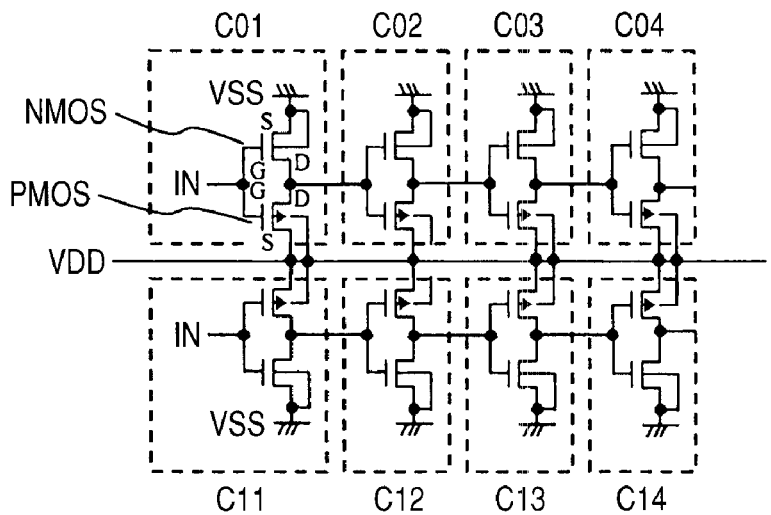
FIG. 4 is an equivalent circuit diagram of a MOS transistor level of the semiconductor integrated circuit shown in FIG. 1.
Figure 5:
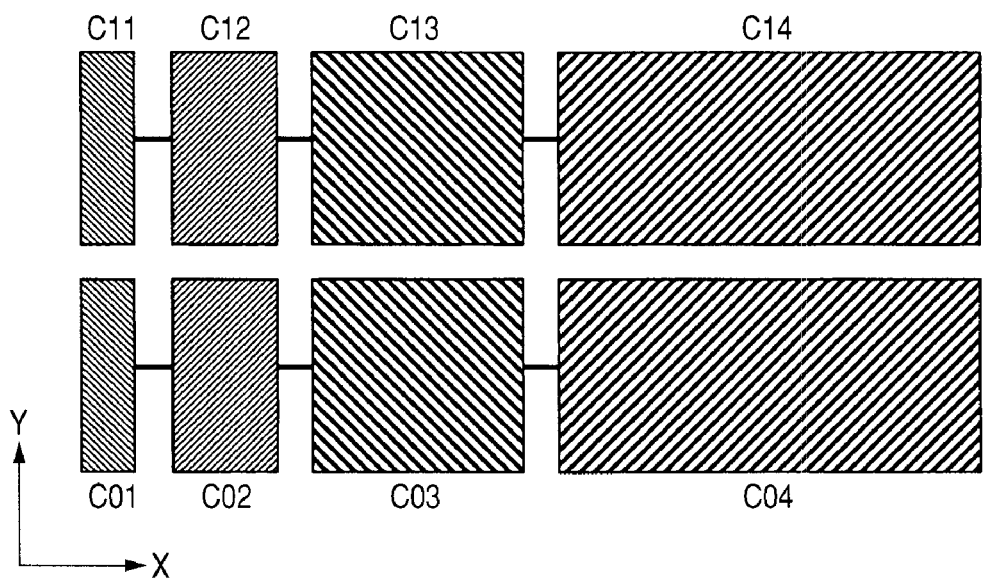
FIG. 5 is a schematic explanatory diagram of a layout state in the semiconductor integrated circuit illustrated in FIG. 1.

FIG. 1 shows an example of layout of a semiconductor integrated circuit according to the present invention. FIG. 2 shows a cross section taken along line A-A' of FIG. 1. FIG. 3 is a cross section taken along line B-B' of FIG. 1. FIG. 4 shows an equivalent circuit at a MOS transistor level of the semiconductor integrated circuit illustrated in FIG. 1. FIG. 5 schematically shows a layout state of cells in the semiconductor integrated circuit illustrated in FIG. 1.

In a semiconductor integrated circuit 10 shown in FIG. 1, although not limited, a plurality of cells each as a unit of layout are formed on a single semiconductor substrate such as a single-crystal silicon substrate and disposed. By combining the plural cells, a block having a predetermined function is formed. Although not limited, as shown in FIG. 4, the cell is formed as an inverter in which a p-channel-type MOS transistor PMOS and an n-channel-type MOS transistor NMOS are coupled in series, and which can invert the logic of an input signal. The inverters are cascade-coupled, thereby forming two inverter chains. A first inverter chain is obtained by cascading inverters C01, C02, C03, and C04. A second inverter chain is obtained by cascading inverters C11, C12, C13, and C14. In FIG. 1, separator lines of the cells are shown by broken lines. The driving capability of the first and second inverter chains increases in order. Specifically, in the first inverter chain, the driving capability increases in order of the inverters C01, C02, C03, and C04, and the gate size of the MOS transistor for forming each of the inverters increases. In the second inverter chain, the driving capability increases in order of the inverters C01, C02, C03, and C04, and the gate size of the MOS transistors for forming the inverters or the number of MOS transistors coupled in parallel increases. The larger the gate size of the MOS transistors is, the larger the chip occupation area becomes. In the embodiment, therefore, as obviously from FIG. 5, the chip occupation area of cells increases in order of the inverters C01, C02, C03, and C04 (C11, C12, C13, and C14). In the embodiment, by disposing the two inverter chains so that P-wells WP1 and WP2 of the blocks are neighboring each other, the P-wells are shared by the plural n-channel-type MOS transistors.

In FIG. 1, an N-well WN1 in which p-channel-type MOS transistors of the inverters C11 to C14 are formed, a P-well WP1 in which n-channel-type MOS transistors of the inverters C11 to C14 are formed, a P-well WP2 in which n-channel-type MOS transistors from the inverters C01 to C04 are formed, and an N-well WN2 in which p-channel-type MOS transistors of the inverters C01 to C04 are formed are disposed in order from the top. The P-wells WP1 and WP2 are integrally provided and generically called P-wells WP.

The inverters C01, C02, C03, and C04 and the inverters C11, C12, C13, and C14 are partitioned in partition positions indicated by the broken lines in FIG. 1. Since the basic configurations of the inverters C01, C02, C03, and C04 and the inverters C1, C12, C13, and C14 are similar to each other, the configuration of the inverter C01 will be described in detail.

The inverter C01 includes the p-channel-type MOS transistor PMOS and the n-channel-type MOS transistor NMOS. The p-channel-type MOS transistor PMOS is formed in the N-well WN2 on a p-type semiconductor substrate (p-sub), and the n-channel-type MOS transistor NMOS is formed in the P-well WP2 on the p-type semiconductor substrate (p-sub). The p-channel-type MOS transistor PMOS and the n-channel-type MOS transistor NMOS have a drain electrode D, a gate electrode G, and a source electrode S. In the case of the n-channel-type MOS transistor NMOS, as shown in FIG. 2, the drain electrode D and the source electrode S are formed in an n$^+$ region whose impurity concentration is higher than that in the N-well. In the case of the p-channel-type MOS transistor PMOS, the drain electrode D and the source electrode S are formed in a p$^+$ region whose impurity concentration is higher than that in the P-well. To the source electrode S of the p-channel-type MOS transistor PMOS, a high-potential-side power source VDD is supplied via a VDD line L1 formed by a first-layer metal line M1 provided at the periphery of the semiconductor integrated circuit 10. To the source electrode S of the n-channel-type MOS transistor NMOS, a low-potential-side power source VSS is supplied via a VSS line L2 formed by the first-layer metal line M1 provided in the center portion of the semiconductor integrated circuit 10. The gate electrode G of the p-channel-type MOS transistor PMOS and the gate electrode G of the n-channel-type MOS transistor NMOS extend in the Y-axis direction as indicated by 12 and are coupled to each other via an input line L3 formed by a second-layer metal line M2. The drain electrode D of the p-channel-type MOS transistor PMOS and the drain electrode D of the n-channel-type MOS transistor NMOS are coupled to each other via an output line L4 formed by the first-layer metal line M1, and an output terminal of the inverter C01 is led out from the coupled part. To an input terminal (gate 12) of the inverter C01 and an input terminal (gate 12) of the inverter C11, an input signal IN which is common to the inverters C01 and C11 is transmitted via the line L3 made by the second-layer metal line M2.

WP01, WP02, WP03, and WP04 in FIGS. 2 and 3 express well portions in transistors in the P-well WP2. Similarly, WN01, WP11, and WN11 show well portions corresponding to the transistors in the corresponding wells WN2, WP1, and WN1. They are shown to facilitate explanation of noise analysis later, and it does not mean that the well regions are electrically separated. In the example, power is supplied to the well region via a tap formed in a block. The tap is an impurity activation layer of the same conduction type as that of the well, and is formed on the surface of the substrate. The impurity concentration of the tap is higher than that of the well region.

The impurity concentration of the same conduction type as that of the well in the tap will be also described as follows.

In a source-drain region 11 of the conduction type opposite to that of the well formed in the surface of the substrate, impurity of the same conduction type as that of the well and low concentration is also included. It can be said that the impurity concentration of the same conduction type as that of the well, of the tap is higher than that of impurity of the same conduction type as that in the well in the source-drain region 11 of the opposite conduction type.

Concretely, in the case of the P-wells WP1 and WP2, it means that the P-type impurity concentration of P-type taps PT (PT1, PT2, and PT3) is higher than that of the P-type impurity concentration in the N-type source-drain region 11 formed in the P-well. Since the tap is coupled to the metal line and can apply voltage to the well, it is also called a feed tap.

In FIG. 1, gates 12 of the transistors extend in the Y direction, and transistors are sequentially arranged from left to right in the X direction.

In the example, the interval of feed taps is set to be equal to or less than eight gates of MOS transistors, and the feed taps are disposed in the center portion in a block and at both ends of the block. In an example shown in FIG. 2, the P-well feed tap PT2 is disposed in a center portion in a block, and the P-well feed taps PT1 and PT3 are disposed at both ends of the block.

In this case, the layout shown in FIG. 1 is divided into regions in the X direction. The region from the tap PT1 to the tap PT2 will be called an "a" region, and the region from the tap PT2 to the tap PT3 will be called a "b" region. In other words, the tap is disposed every plural transistors so that the plural transistors are sandwiched by the neighboring taps.

The P-well region WP1 corresponding to the n-channel-type MOS transistors in the inverters C11, C12, C13, and C14 and the P-well region WP2 corresponding to the n-channel-type MOS transistors in the inverters C01, C02, C03, and C04 are integrated as a P-well region WP. For example, as obvious from FIG. 3, the P-well region WP2 of the inverter C01 and the P-well region WP1 of the inverter C11 are coupled to each other and integrated, thereby constructing the P-well region WP. Similarly, in the "b" region, the P-well region is shared by the inverters C04 and C14. As obvious from FIG. 2, the inverters C01, C02, C03, and C04 and the taps PT1 and PT2 are isolated by isolation regions 13.

Using the first-layer metal line M1, the VDD line for supplying the high-potential-side power source VDD and the VSS line for supplying the low-potential-side power source VSS are formed. Via the VDD line and the VSS line, the power source for operating the inverters is supplied. Via the lines, the low-potential-side power source VSS is supplied to the p-wells WP1 and WP2, and the high-potential-side power source VDD is supplied to the N wells WN1 and WN2.

An object to be compared with the semiconductor integrated circuit 10 shown in FIG. 1 will now be described.

Figure 7:
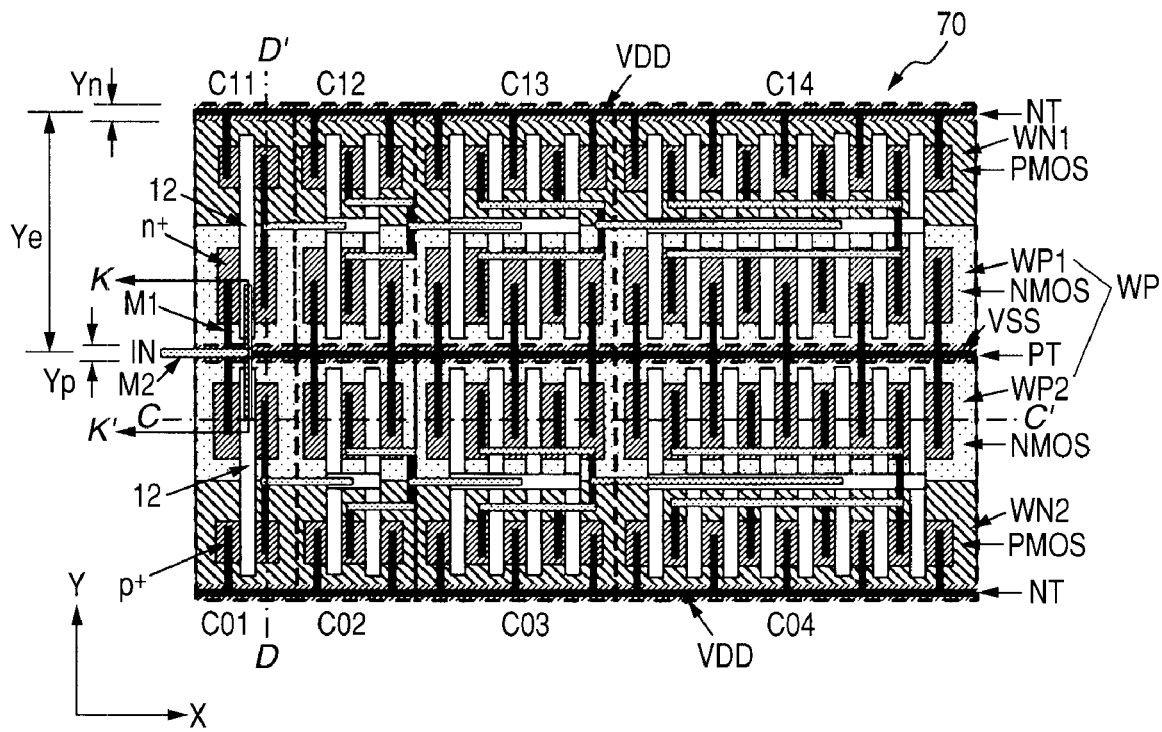
FIG. 7 is a plan view showing an example of layout of a semiconductor integrated circuit to be compared with the semiconductor integrated circuit illustrated in FIG. 1.
Figure 8:
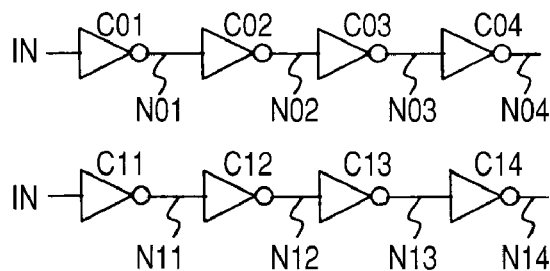
FIG. 8 is an equivalent circuit diagram of the semiconductor integrated circuit shown in FIG. 7.
Figure 9:
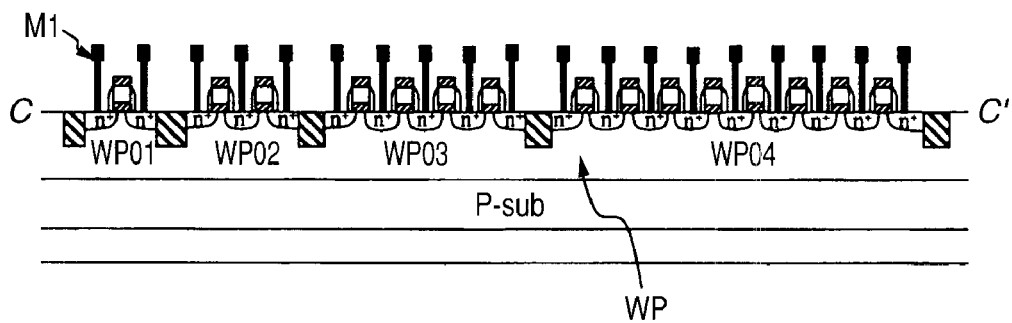
FIG. 9 is a cross section taken along line C-C' in FIG. 7.
Figure 10A:
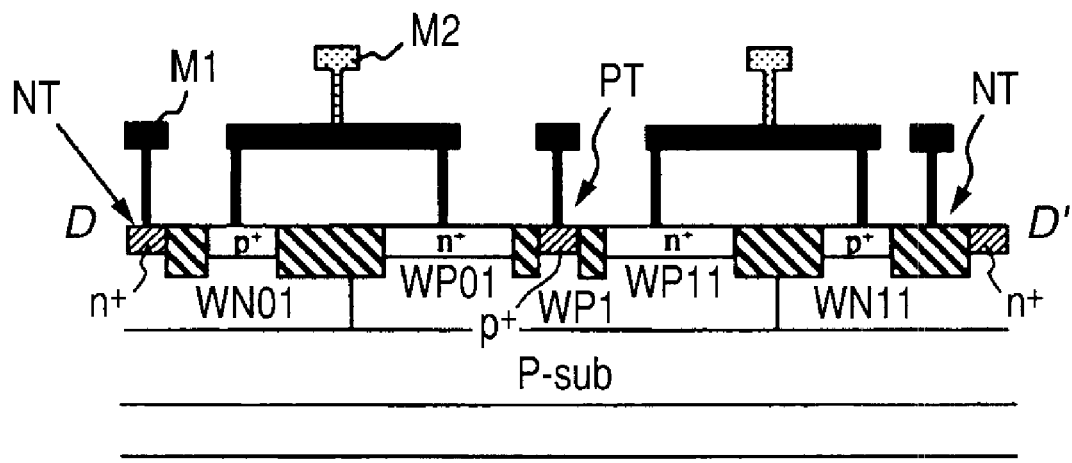
FIG. 10A is a cross section taken along line D-D' in FIG. 7.
Figure 10B:
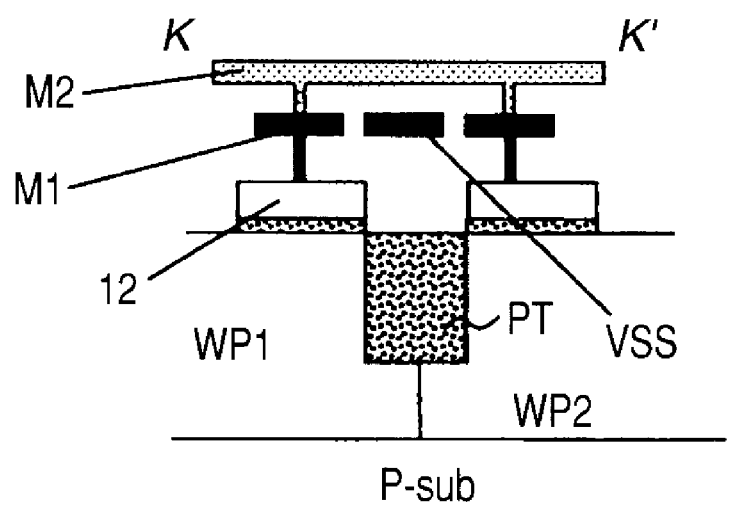
FIG. 10B is a cross section taken along line K-K' in FIG. 7.

FIG. 7 shows an example of the layout of a semiconductor integrated circuit 70 to be compared with the semiconductor integrated circuit 10 shown in FIG. 1. FIG. 8 shows an equivalent circuit of the semiconductor integrated circuit 70 illustrated in FIG. 7. FIG. 9 shows a sectional view taken along line C-C' in FIG. 7. FIG. 10A shows a sectional view taken along D-D' in FIG. 7. FIG. 10B shows a sectional view taken along K-K' in FIG. 7.

Also in the semiconductor integrated circuit 70 shown in FIG. 7, two inverter chains each constructed by cascading a plurality of inverters as shown in FIG. 8 are formed.

In the circuit layout shown in FIG. 7, a tap NT for feeding power to the N-well regions WN1 and WN2 is provided at the periphery of the semiconductor integrated circuit 70, and a tap PT for feeding power to the P-well regions WP is provided in a center portion of the semiconductor integrated circuit 70. Widths in the Y-axis direction of the taps NT and PT are shown by Yn and Yp, respectively. Since the N-well feed tap NT and the P-well feed tap PT are disposed at the periphery of each of the cells, the maximum value of well resistance is determined by length from the feed tap to the border between the P well and the N well. The well resistance value in each of the cells is constant without depending on the number of gates. In the layout configuration, however, the feed tap regions (NT and PT) always exist in each of the cells and are a part of the N well and the P well, so that the chip area of the semiconductor integrated circuit 70 is large. That is, in the configuration shown in FIG. 7, since the feed taps (NT and PT) are provided for each of the cells, the chip area is large due to the existence of the feed taps (NT and PT).

Figure 11:
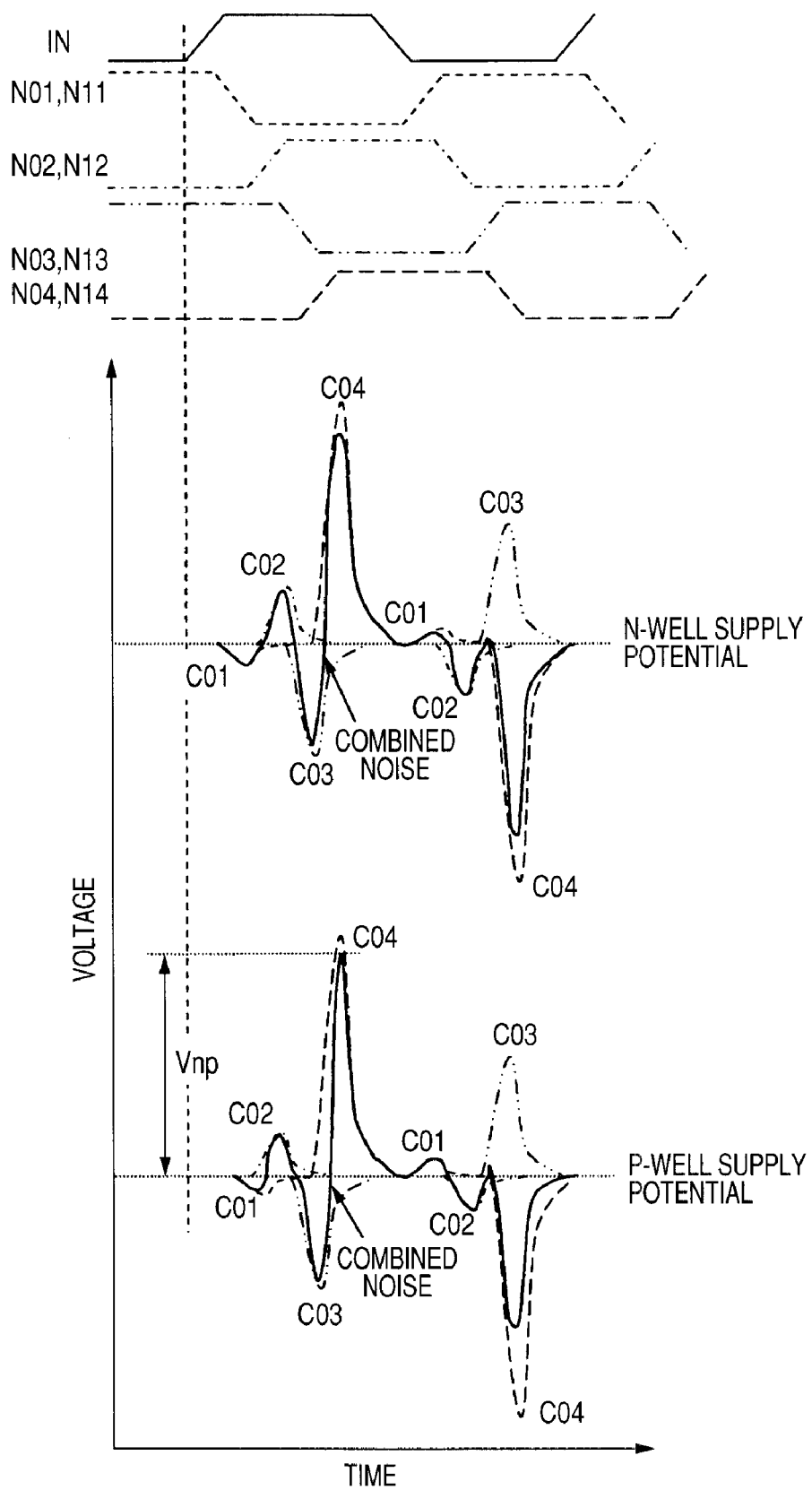
FIG. 11 is a waveform chart of input/output signals and well potential fluctuations in the semiconductor integrated circuit shown in FIG. 7.

FIG. 11 shows the relation between input/output signals in the semiconductor integrated circuit 70 illustrated in FIG. 7 and the well potential fluctuations.

Well noise which occurs in each of the inverters C01 to C04 and C11 to C14 becomes combined noise in each of the well regions. However, the feed tap is disposed in the border between the two inverter chains (C01 to C04) and (C11 to C14), noises occurring in the inverter chains do not interfere each other. Since the feed tap is always disposed for each of the cells, the chip area becomes larger by the amount of the region.

On the other hand, in the semiconductor integrated circuit 10 shown in FIG. 1, feed taps are disposed in arbitrary positions in the block and no feed tap is disposed at the periphery of each cell. Consequently, the number of feed taps can be decreased as compared with the configuration of disposing the feed tap to each of the cells as shown in FIG. 7, and the chip area can be reduced by the decreased amount.

By eliminating the feed taps disposed in the cells in FIG. 7, length Yi in the Y direction of the block (see FIG. 1) becomes shorter than length Ye in the case shown in FIG. 7. Since the feed tap is provided in the block, length in the X direction increases only by the amount of increase in a tap region. However, the chip area is reduced as compared with the effect that the length in the Y direction decreases. By widening the interval of the feed taps in the range where well noise is permitted and decreasing the number of taps, the chip area can be further reduced.

Figure 6:
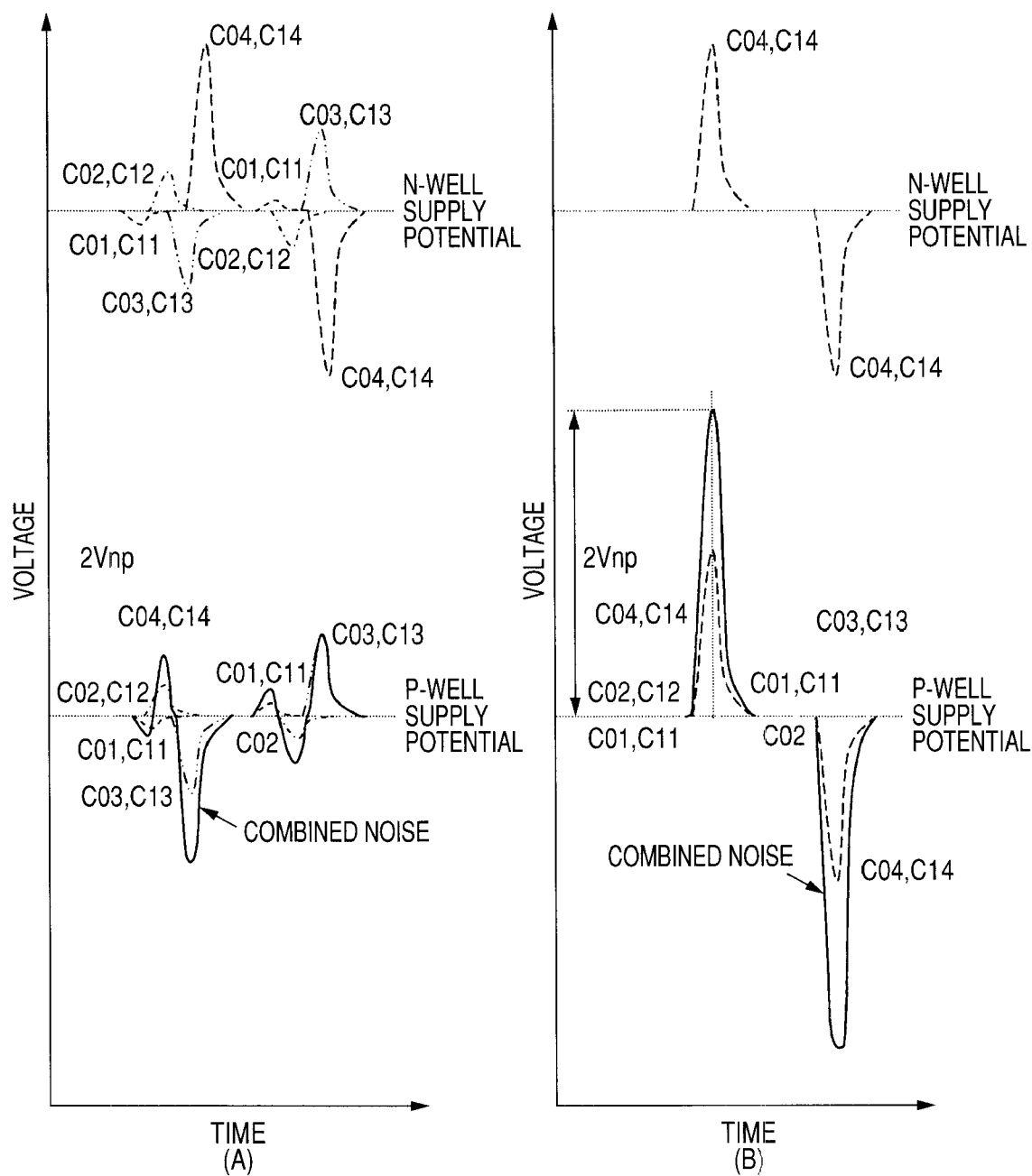
FIG. 6 is a waveform chart of well potential fluctuations in the configuration shown in FIG. 1.

FIGS. 6A and 6B show fluctuations in the well potential in the semiconductor integrated circuit 10 illustrated in FIG. 1. A well potential fluctuation indicated by a broken line is of a single inverter. A well potential fluctuation indicated by a solid line is combination of well potential fluctuations.

FIG. 6A shows the well potential fluctuations in the "a" region in FIG. 1, and FIG. 6B indicates the well potential fluctuations in the "b" region in FIG. 1.

In the embodiment, two inverter chains are disposed adjacent to each other, so that output signals of the inverters C01 to C04 have sequentially different phases (a rise signal and a fall signal vary stage by stage), and well noise causes positive and negative potential fluctuations using the well supply potential as the border stage by stage. Between the inverter chains, the well noise is cancelled before and after the inverters. On the other hand, the adjacent inverter chain also performs similar operation. Consequently, as shown in FIGS. 6A and 6B, for example, well noise which occurs in a P-well WP is combination of well noises in P-wells WP01 and WP11, which is twice (2Vnp) as large as well noise which occurs in a single P well.

In the embodiment, the following effects can be obtained.

(1) Since the feed taps are disposed every plural transistors so as to sandwich the plural transistors and so as to face in the longitudinal direction of the gates, the length Yi in the Y direction of the block becomes shorter than the length Ye in the case show in FIG. 7. Although the length in the X direction increases only by the amount of the tap region (the size in the X direction) increased by the feed taps provided in the block, the chip area becomes smaller as compared with the effect that the length in the Y direction is shortened.

(2) The number of taps can be decreased by widening the intervals of the feed taps in the range where well noise is permitted, so that the chip area can be further reduced.

Second Embodiment

A second embodiment will be described.

Figure 12A:
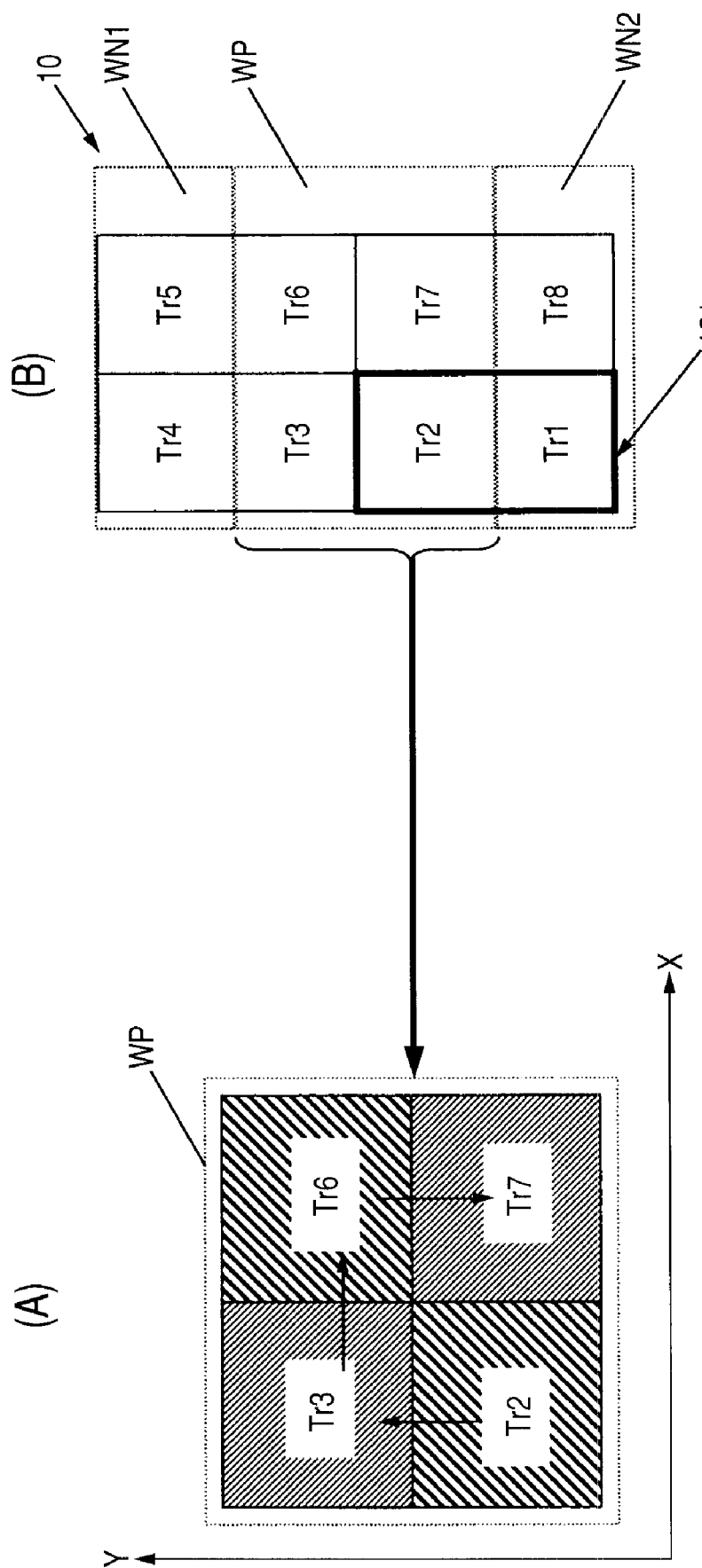
FIG. 12A is an explanatory diagram of an example of the layout of a semiconductor integrated circuit according to the present invention.

FIG. 12A shows a layout example of the semiconductor integrated circuit 10.

In the semiconductor integrated circuit 10, as shown in (B) in FIG. 12A, an N well WN1 in which p-channel-type MOS transistors Tr4 and Tr5 are formed, a P well WP in which n-channel-type MOS transistors Tr3, Tr6, Tr2, and Tr7 are formed, and an N well WN2 in which p-channel-type MOS transistors Tr1 and Tr8 are formed are disposed in order from top. The n-channel-type MOS transistors Tr2, Tr3, Tr6, and Tr7 share the P well. An inverter is formed by coupling the p-channel-type MOS transistor Tr1 and the n-channel-type MOS transistor Tr2 in series. An inverter is formed by coupling the p-channel-type MOS transistor Tr8 and the n-channel-type MOS transistor Tr7 in series. An inverter is formed by coupling the p-channel-type MOS transistor Tr4 and the n-channel-type MOS transistor Tr3 in series. An inverter is formed by coupling the p-channel-type MOS transistor Tr5 and the n-channel-type MOS transistor Tr6 in series. By coupling the inverters to each other, a signal can be transmitted in a predetermined direction.

Description will be given paying attention to the MOS transistors Tr2, Tr3, Tr6, and Tr7 sharing the P well as shown in FIG. 12A. The MOS transistor Tr3 is disposed adjacent to the MOS transistor Tr2 along the Y axis. The MOS transistor Tr6 is disposed adjacent to the MOS transistor Tr3 along the X axis orthogonal to the Y axis. The MOS transistor Tr7 is disposed adjacent to the MOS transistor Tr2 along the X axis and disposed adjacent to the MOS transistor Tr6 along the Y axis. When a signal is transmitted in order of Tr2, Tr3, Tr6, and Tr7, the logic of the signal is inverted in each of the MOS transistors Tr2, Tr3, Tr6, and Tr7. Consequently, an output signal of the MOS transistor Tr2 and an output signal of the MOS transistor Tr3 have phases opposite to each other. An output signal of the MOS transistor Tr3 and an output signal of the MOS transistor Tr6 have phases opposite to each other. An output of the MOS transistor Tr6 and an output signal of the MOS transistor Tr7 have phases opposite to each other. Changes in the logic of the output signal of the MOS transistors cause fluctuations in well potential (well noise). However, in the case where the P well is shared and output signals of the MOS transistors disposed adjacent to each other have opposite phases, the outputs of the MOS transistors operate so as to cancel off the potential fluctuations in the P well. Thus, well noise can be reduced.

Since an output signal of the MOS transistor Tr2 and an output signal of the MOS transistor Tr6 have the same phase, the potential fluctuations in the P well WP cannot be canceled off. However, the distance between the MOS transistors Tr2 and Tr6 is longer than that between MOS transistors disposed adjacent to each other along the X or Y axis, so that the influence on well noise is small. Since a signal is transmitted from the MOS transistor Tr2 to the MOS transistor Tr6 via the MOS transistor Tr3, a time difference occurs between the well noises occurring in Tr2 and Tr6. Consequently, the noise overlap part is small, and the influence on well noise is small.

Figure 12B:
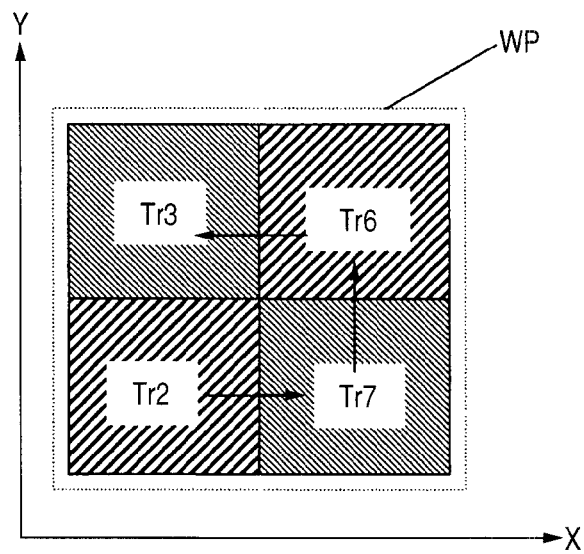
FIG. 12B is another explanatory diagram of an example of the layout of the semiconductor integrated circuit according to the invention.

FIG. 12B shows another layout example of the semiconductor integrated circuit 10. FIG. 12B shows the MOS transistors Tr2, Tr3, Tr6, and Tr7 sharing the P well in a manner similar to the case shown in (A) in FIG. 12A.

The semiconductor integrated circuit 10 shown in FIG. 12B is largely different from that shown in FIG. 12A with respect to the signal transmission direction. Specifically, in the configuration shown in FIG. 12B, the MOS transistor Tr7 is disposed adjacent to the MOS transistor Tr2 along the X axis. The MOS transistor Tr6 is disposed adjacent to the MOS transistor Tr7 along the Y axis orthogonal to the X axis. The MOS transistor Tr3 is disposed adjacent to the MOS transistor Tr6 along the X axis and disposed adjacent to the MOS transistor Tr2 along the Y axis. An output signal of the n-channel-type MOS transistor Tr2 is transmitted to the n-channel-type MOS transistor Tr7, an output signal of the n-channel-type MOS transistor Tr7 is transmitted to the n-channel-type MOS transistor Tr6, and an output signal of the n-channel-type MOS transistor Tr6 is transmitted to the n-channel-type MOS transistor Tr3.

Since the logic of the signal is inverted in each of the MOS transistors Tr2, Tr7, Tr6, and Tr3, an output signal of the MOS transistor Tr2 and an output signal of the MOS transistor Tr7 have phases opposite to each other. An output signal of the MOS transistor Tr7 and an output signal of the MOS transistor Tr6 have phases opposite to each other. An output of the MOS transistor Tr6 and an output signal of the MOS transistor Tr3 have phases opposite to each other. Therefore, also in the configuration shown in FIG. 12B, like in the case shown in FIG. 12A, in the case where the P well is shared and output signals of MOS transistors disposed adjacent to each other have opposite phases, the outputs of the MOS transistors act so as to cancel off the potential fluctuations in the P well. Thus, well noise can be reduced.

By the second embodiment, the following effects can be obtained.

(1) In the case where the P well WP is shared and output signals of MOS transistors disposed adjacent to each other have opposite phases, the outputs of the MOS transistors act so as to cancel off the potential fluctuations in the P well WP. Thus, well noise can be reduced.

(2) Since the well noise can be reduced by the effect (1), a configuration of disposing feed taps every plural transistors so as to surround the plural transistors shown in FIG. 1 of the first embodiment and so as to face the longitudinal direction of the gates may be applied to the configuration shown in FIGS. 12A and 12B.

Since the configuration of reducing well noise is employed in the second embodiment, it is considered the necessity to provide taps continuously between the P wells WP01 and WP11 (WP1) as shown in FIG. 7 is low.

Also by changing the configuration to the configuration of disposing feed taps every plural transistors so as to surround the plural transistors and so as to face the longitudinal direction of gates, the influence of the well noise can be suppressed. By widening the tap interval by the effect, the feed tap area is decreased. Thus, the chip area can be further reduced.

In (B) in FIG. 12A, n-channel-type MOS transistors formed in the P well may be used as the MOS transistors Tr1, Tr8, Tr4, and Tr5, and p-channel-type MOS transistors formed in the N well may be used as the MOS transistors Tr2, Tr7, Tr3, and Tr6. In the case where the N well NW is shared and output signals of the MOS transistors disposed adjacent to each other have opposite phases, outputs of the MOS transistors act so as to cancel out the potential fluctuations in the N well.

Third Embodiment

A third embodiment will be described.

Figure 12C:
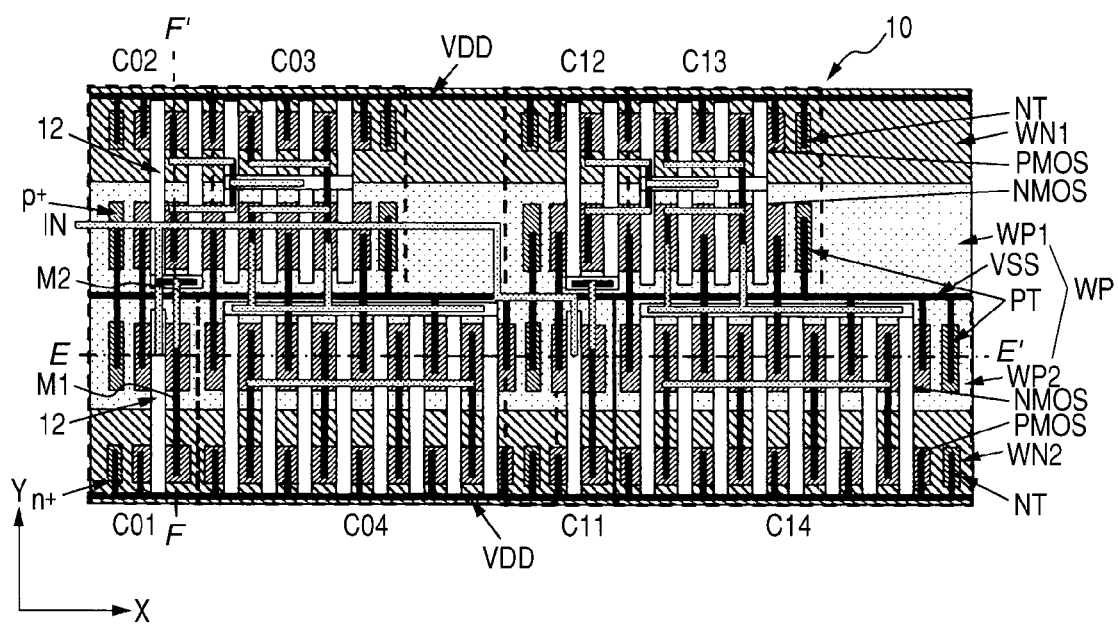
FIG. 12C is a plan view showing another layout example of the semiconductor integrated circuit according to the invention.
Figure 13:
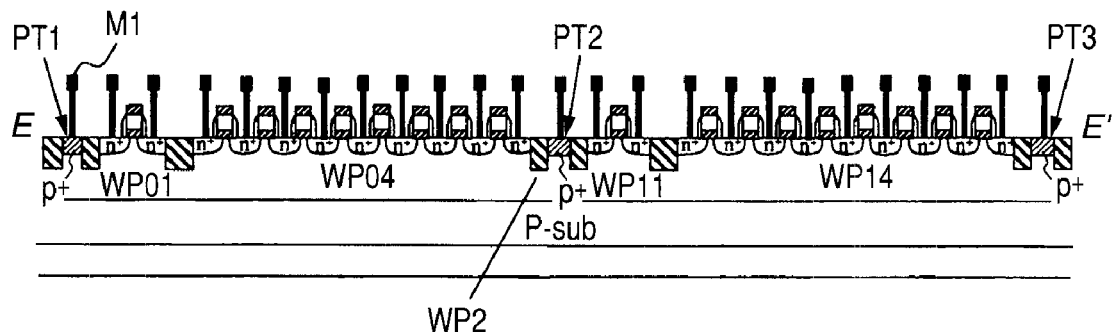
FIG. 13 is a cross section taken along line E-E' in FIG. 12C.
Figure 14:
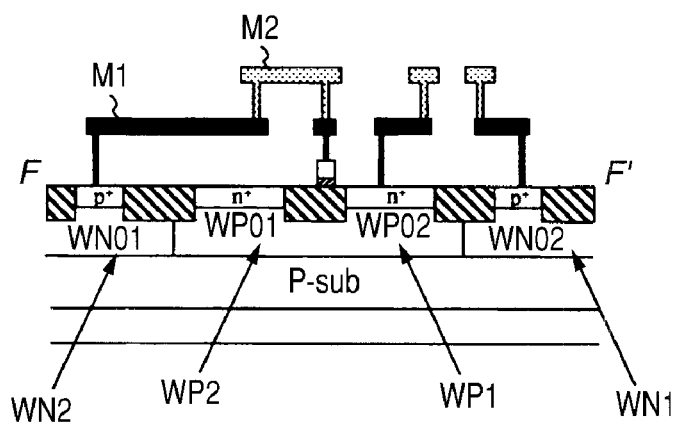
FIG. 14 is a cross section taken along line F-F' in FIG. 12C.
Figure 15:
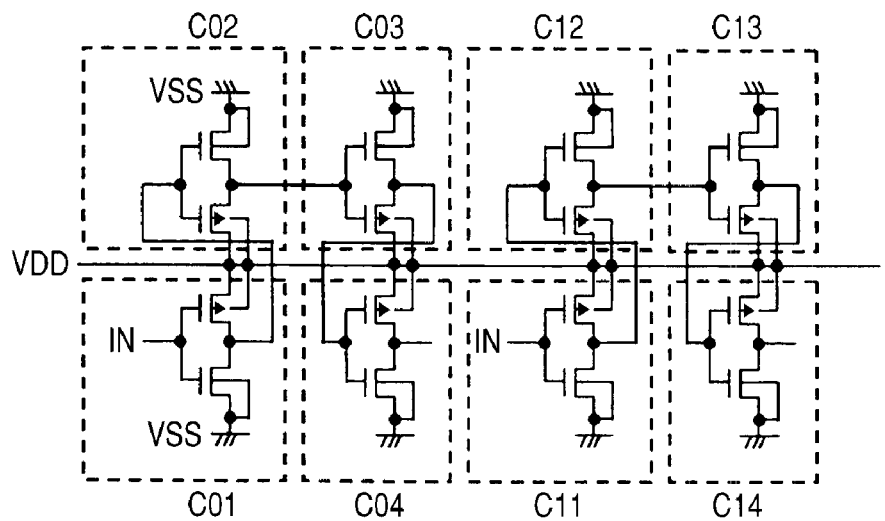
FIG. 15 is an equivalent circuit diagram of a MOS transistor level of the semiconductor integrated circuit shown in FIG. 12C.
Figure 16:
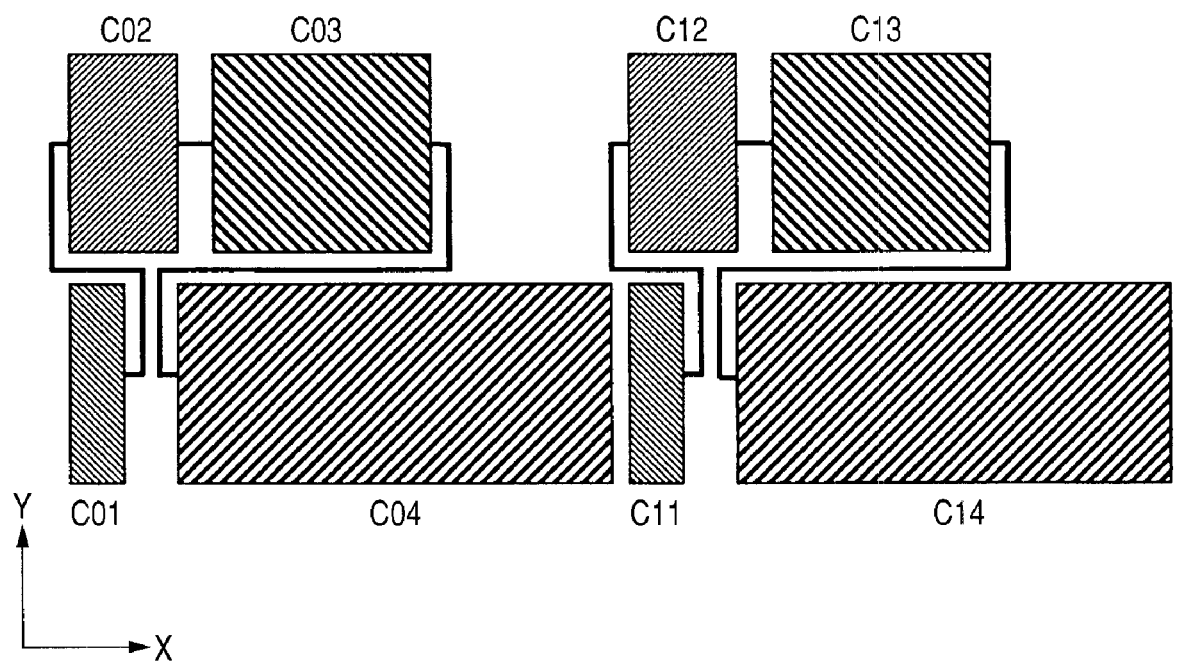
FIG. 16 is a schematic explanatory diagram of a layout state in the semiconductor integrated circuit illustrated in FIG. 12C.

FIG. 12C shows another layout example of the semiconductor integrated circuit 10 according to the invention. FIG. 13 is a cross section taken along line E-E' in FIG. 12C. FIG. 14 is a cross section taken along line F-F' in FIG. 12C. FIG. 15 shows an equivalent circuit of a MOS transistor level of the semiconductor integrated circuit 10 shown in FIG. 12C. FIG. 16 schematically shows a layout state of cells in the semiconductor integrated circuit 10 illustrated in FIG. 12C.

The semiconductor integrated circuit 10 shown in FIG. 12C includes a plurality of inverters C01 to C04 and C11 to C14 as shown in FIG. 15. Each of the plurality of inverters C01 to C04 and C11 to C14 is constructed by coupling a p-channel-type MOS transistor and an n-channel-type MOS transistor in series. When the inverters C0, C02, C03, and C04 and the inverters C11, C12, C13, and C14 share the P wells WP (WP1 and WP2) as shown in FIG. 12A and output signals of MOS transistors disposed adjacent to each other have phases opposite to each other, outputs of the MOS transistors act so as to cancel off the potential fluctuations in the P wells PW. Specifically, the inverter C01 and the inverter C02 to which an output signal of the inverter C01 is input are disposed so as to be adjacent to each other in the P well WP. The inverter C03 next to the inverter C02 is disposed side by side. The inverter C04 next to the inverter C03 and the inverter C03 are disposed so as to be adjacent to each other in the P well WP. Similarly, the inverter C11 and the inverter C12 to which an output signal of the inverter C11 is input are disposed so as to be adjacent to each other in the P well WP. The inverter C13 next to the inverter C12 is disposed side by side. The inverter C14 next to the inverter C13 and the inverter C13 are disposed so as to be adjacent to each other in the P well WP. With the configuration, a plurality of cells are disposed so that output logic levels of the cells adjacent to each other are different from each other. In a manner similar to the case shown in FIG. 12A, the n-channel-type MOS transistors in the plurality of inverters C1, C12, C13, and C14 share the P wells WP (WP1 and WP2) and output signals of the MOS transistors disposed adjacent to each other have opposite phases. As shown in FIG. 13, noise occurring in the P well WP01 in a region sandwiched by the P-well feed taps PT1 and PT2 and noise occurring in the P well WP04 become positive and negative potential fluctuations using the well feed potential as the border. Similarly, as shown in FIG. 14, noises occurring in the P wells WP01 and WP02 also become positive and negative potential fluctuations.

WP01, WP04, WP11, and WP14 in FIGS. 13 and 14 indicate wells corresponding to the transistors in the P well WP2. WP02 denotes a well corresponding to a transistor in the P well WP1. Similarly, WN01 and WN02 indicate wells corresponding to the transistors in the wells WN2 and WN1. They are shown to facilitate explanation of noise analysis to be given later, and the well region is not electrically separated.

Figure 17:
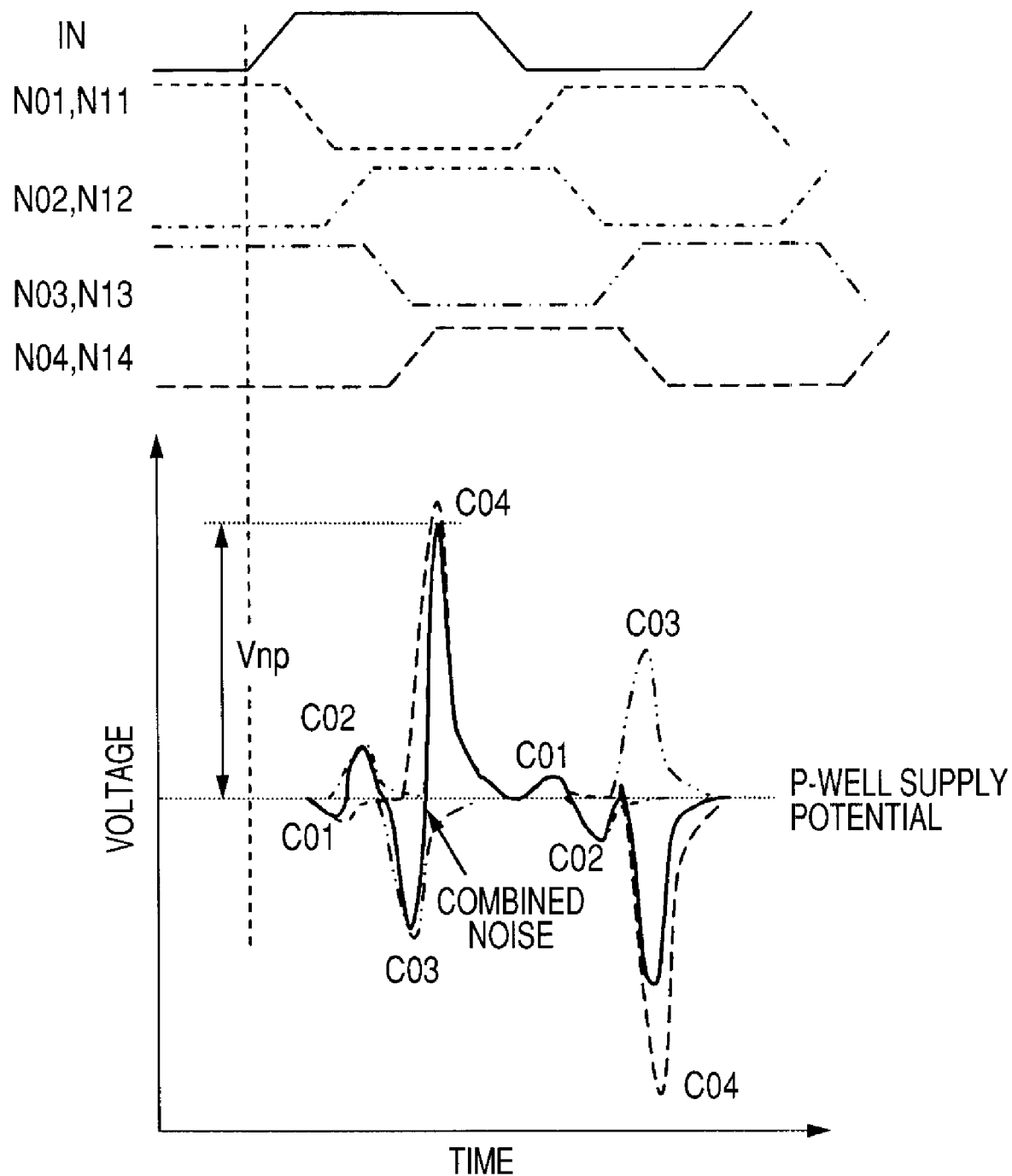
FIG. 17 is a waveform chart of input/output signals and well potential fluctuations in the semiconductor integrated circuit shown in FIG. 12C.

FIG. 17 is a waveform chart of input/output signals and well potential fluctuations in the semiconductor integrated circuit shown in FIG. 12C. Well noises occurring in the inverter chain (C01 to C04) occur in the same well region and are combined. Since the positive and negative signs of the well noises in the inverters C01 and C02 are different from each other, the well noises cancel each other. However, the gate size of the inverter C02 is about twice as large as the inverter C01 and there is also a delay in occurrence of the noises, so the offset potential does not become 0V. Similarly, noises in the inverters C02 and C03 also cancel each other and noises in the inverters C03 and C04 also cancel each other. Consequently, the well noise occurring in the areas is smaller than that occurring in a single cell.

As shown in FIG. 17, the noises occurring in the cells C01 and C03 have positive and negative potentials using the well supply potential as the border. When the noises are combined, the noise increases. However, there is a delay of an amount of one inverter at the noise occurrence time, so that a noise overlap part hardly exists.

The inverters (C11 to C14) in the inverter chain are disposed side by side while sandwiching the well supply taps PT2 and PT3. Since they are disposed in a manner similar to the inverter chain (C01 to C04), the well noise cancel-out effect in the inverter chain (C11 to C14) is similar to that in the inverter chain (C01 to C04). Since the feed tap PT is interposed between the inverter chains (C01 to C04 and C11 to C14), the influence of well noise is hardly exerted.

The third embodiment produces an effect of reducing the tap region to reduce the area in a manner similar to the semiconductor integrated circuit 10 shown in FIG. 1.

In particular, in the third embodiment, a plurality of cells are disposed so that output logic levels of cells disposed adjacent to each other become different from each other, so that well noises cancel each other in the same well region. Therefore, the well noises can be reduced. Since the well noises are reduced, in the case of determining the interval of feed taps in the range where the well noises are reduced, the interval between the feed taps can be further widened. Thus, the number of feed taps can be reduced by the widened amount, and the chip area can be further reduced.

In the third embodiment, in a manner similar to the case of FIG. 12A, attention is paid only to the n-channel-type MOS transistors. By paying attention also to the p-channel-type MOS transistors constructing the inverters, an effect similar to the reduction in the N well noise can be also obtained.

In the case where the layout of the third embodiment cannot be applied simultaneously to the n-channel-type MOS transistors and the p-channel-type MOS transistors when a plurality of blocks are arranged in the column direction, the layout of the third embodiment may be applied to the transistors having a higher well resistance value.

According to well noise occurring in a well, the tap interval (the number of gates between taps) may be controlled well by well.

Although inverters are taken as an example in the embodiment, similar effects can be also obtained in the case where output signals of logic circuits other than inverters are complementary. The embodiment is not limited to the inverter chain. The effect of reducing the well noise is also produced in circuits disposed adjacent to each other, to which inputs are independent of each other and in which signals are complementary.

Embodiment

A fourth embodiment will be described.

Figure 18:
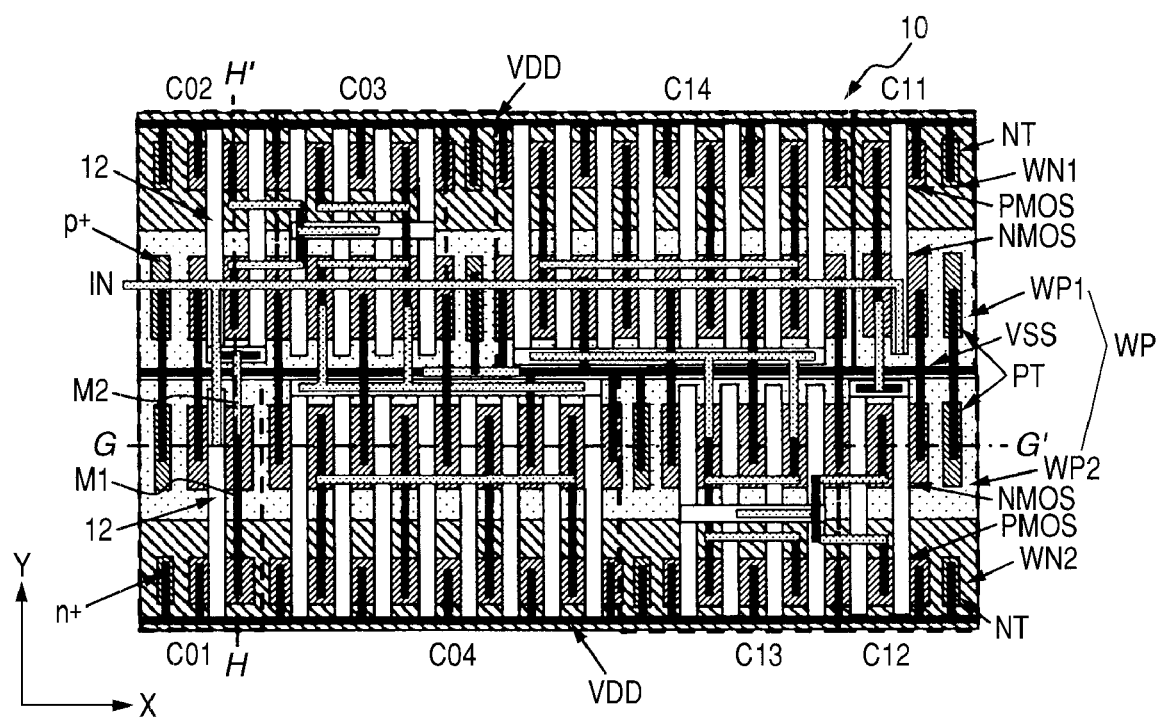
FIG. 18 is a plan view showing another layout example of the semiconductor integrated circuit according to the present invention.
Figure 19:
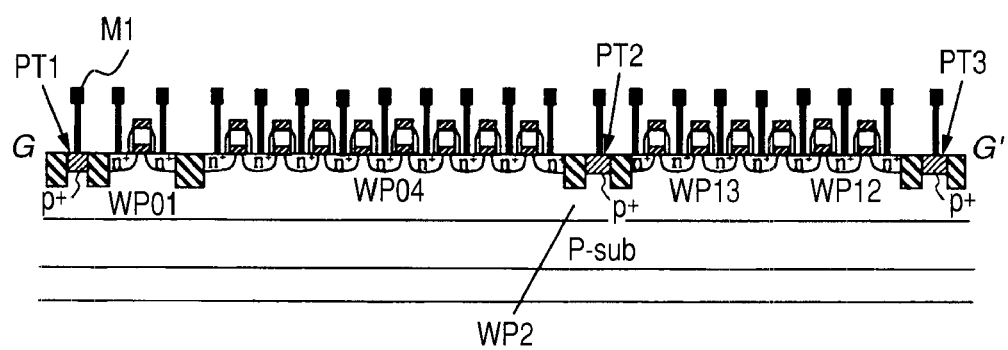
FIG. 19 is a cross section taken along line G-G' in FIG. 18.
Figure 20:
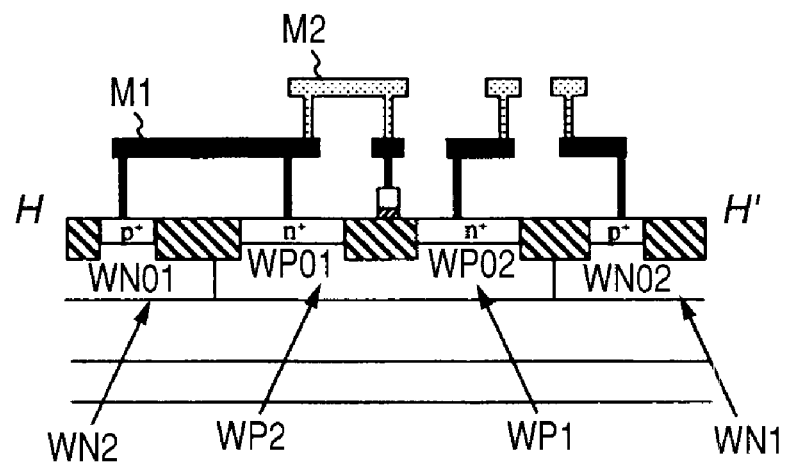
FIG. 20 is a cross section taken along line H-H' in FIG. 18.
Figure 21:
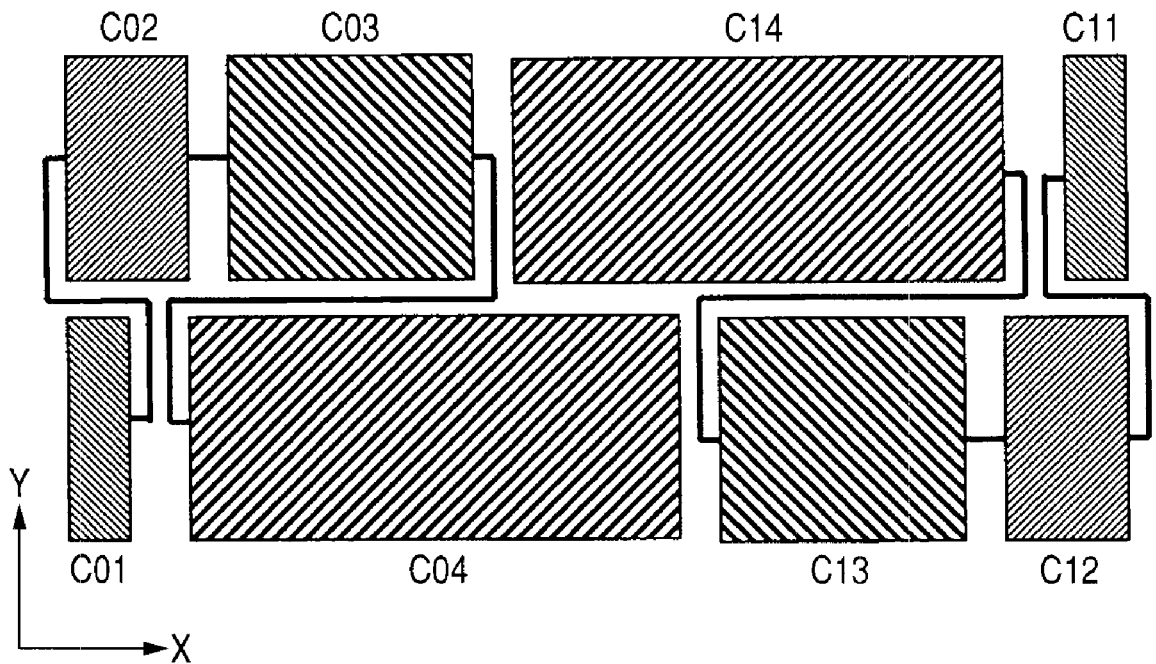
FIG. 21 is a schematic explanatory diagram of a layout state in the semiconductor integrated circuit illustrated in FIG. 18.

FIG. 18 shows another layout example of the semiconductor integrated circuit 10 according to the invention. FIG. 21 schematically shows a layout state of cells in the semiconductor integrated circuit 10 illustrated in FIG. 18. The semiconductor integrated circuit 10 shown in FIG. 18 includes a plurality of inverters C01 to C04 and C11 to C14. The semiconductor integrated circuit 10 shown in FIG. 18 largely differs from that shown in FIG. 12C with respect to the layout of the inverter. As obviously understood from comparison between FIGS. 16 and 21, the inverters C11 to C14 in FIG. 21 are disposed so as to be turned by 180 degrees from the state of FIG. 16. FIG. 19 is a cross section taken along line G-G' in FIG. 18. FIG. 20 is a cross section taken along line H-H' in FIG. 18.

As shown in FIG. 19, the P wells WP01 and WP04 are disposed in a region sandwiched by P-well feed taps PT1 and PT2. Well noises occurring in the P wells WP01 and WP04 become positive and negative potential fluctuations using the well feed potential as the border. The well noises occurring in the P wells WP01 and WP02 shown in FIG. 20 are the same as those in the case shown in FIG. 14.

Figure 22:
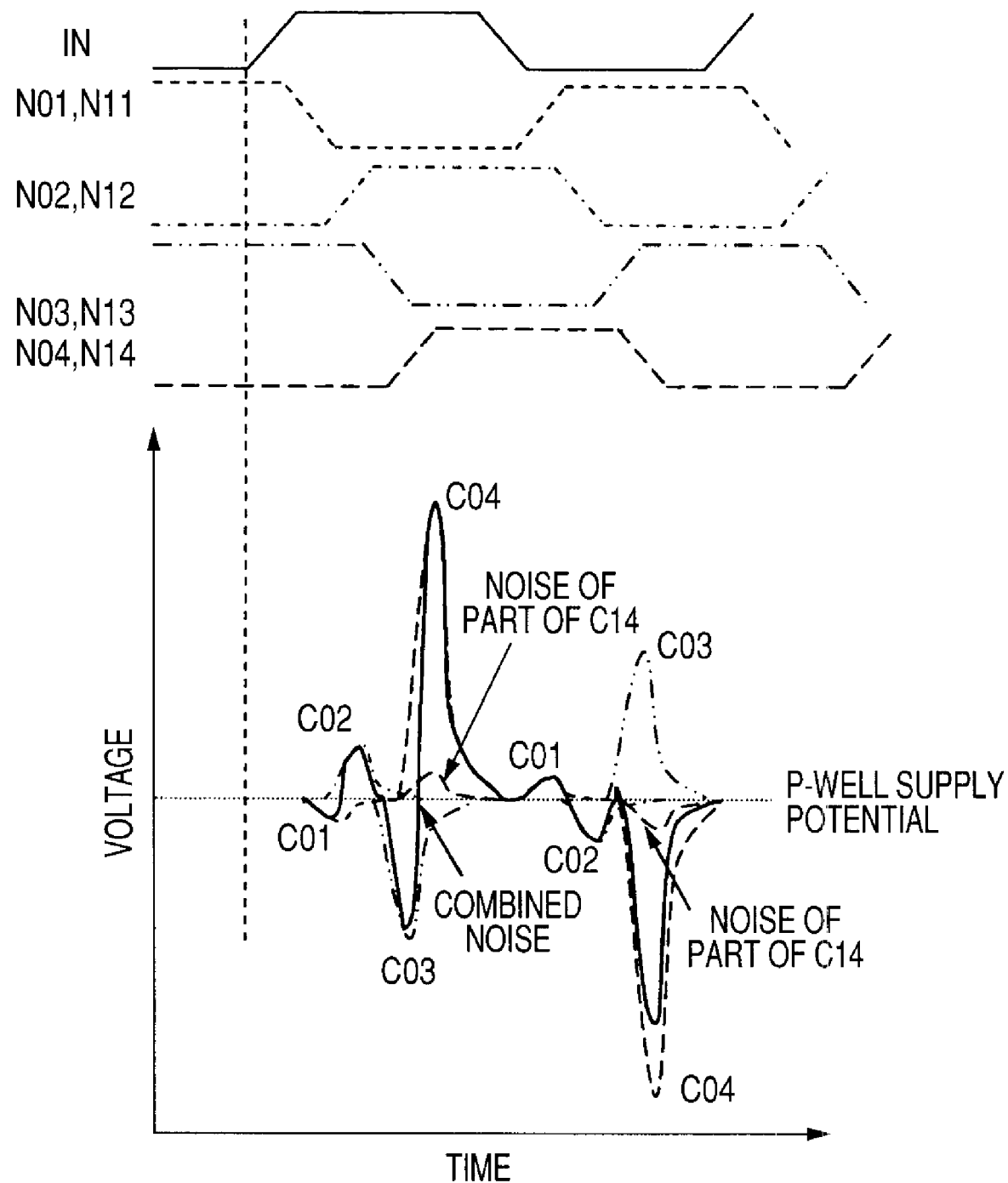
FIG. 22 is a waveform chart of input/output signals and well potential fluctuations in the semiconductor integrated circuit shown in FIG. 18.

FIG. 22 shows the relation between input/output signals in the semiconductor integrated circuit 10 illustrated in FIG. 18 and well potential fluctuations. As shown in FIG. 22, a noise obtained by combining noises occurring in the inverters C01 to C04 interferes with a part of the well noise occurring in the inverter C14. Specifically, as shown in FIG. 18, the three gates of the inverters C04 and C14 face each other, so that the layout in the direction of the X axis of the semiconductor integrated circuit 10 becomes shorter than that in the case of the third embodiment. However, the noise interferes with a part of the well noise occurring in the inverter C14. For example, as shown in FIG. 22, the maximum value of the combined noise including noise in the inverter C14 is almost equal to the maximum value of noise occurring only in the inverter C04.

In the fourth embodiment, attention is paid only to the n-channel-type MOS transistors. By applying the method to the p-channel-type MOS transistors constructing the inverters, an effect similar to the reduction in the well noise can be also obtained.

When a plurality of blocks are arranged in the column direction and the circuit configuration of the fourth embodiment cannot be applied simultaneously to the n-channel-type MOS transistors and the p-channel-type MOS transistors, the layout of the fourth embodiment may be applied to the transistors having a higher well resistance value.

Although inverters are taken as an example in the embodiment, similar effects can be also obtained in the case where output signals of circuits other than inverters are complementary. The fourth embodiment can be applied to the circuits.

The invention is not limited to the inverter chain. The effect of reducing the well noise is also produced in circuits disposed adjacent to each other, to which inputs are independent of each other and in which signals are complementary.

In the fourth embodiment, two inverter chains are disposed in a point-symmetrical manner so that the difference of numbers of gates disposed in the P wells WP1 and WP2 becomes small.

When two inverter chains are disposed in parallel as shown in FIGS. 12C and 16 of the third embodiment, the difference of numbers of gates disposed in the P wells WP1 and WP2 is larger than that in FIG. 18. In other words, a large redundant portion in which gates are not disposed exists.

As described above, in the embodiment, by decreasing the redundant portion in which gates are not disposed, the layout area can be reduced.

Although the case of using two same inverter chains has been described, the invention is not limited to the case where the same circuits are arranged. Two different circuits may be employed as long as the difference of numbers of gates disposed in the P wells WP1 and WP2 is smaller than that in the case where two circuits are arranged in parallel. The invention can be also applied to N wells.

Fifth Embodiment

A fifth embodiment will be described.

Figure 23:
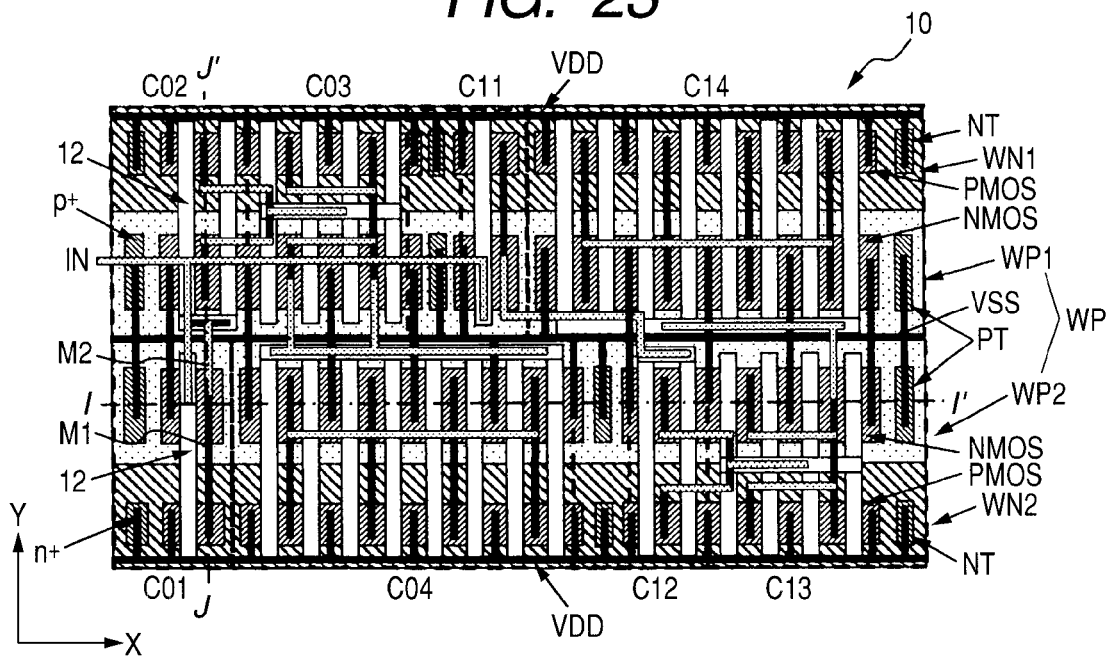
FIG. 23 is a plan view showing another layout example of the semiconductor integrated circuit according to the present invention.
Figure 24:
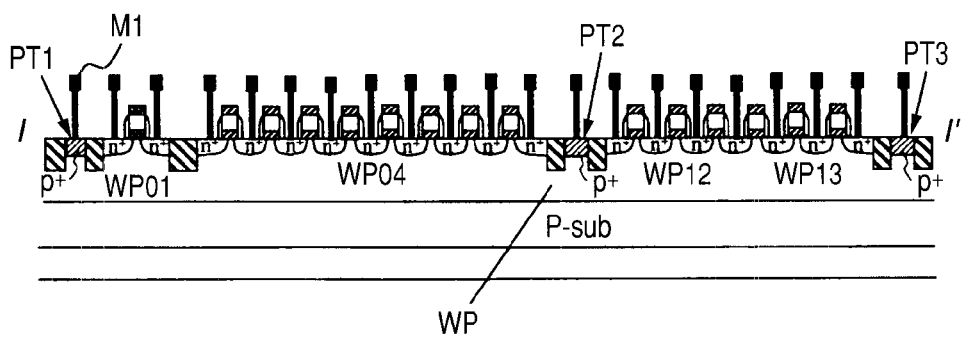
FIG. 24 is a cross section taken along line I-I' in FIG. 23.
Figure 25:
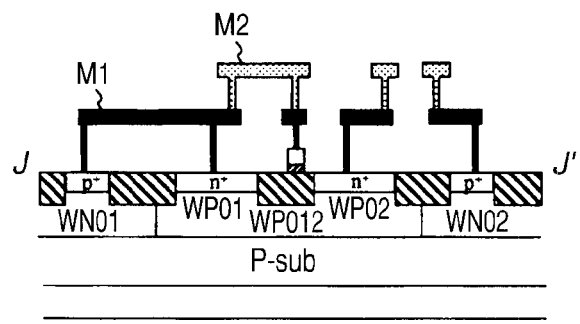
FIG. 25 is a cross section taken along line J-J' in FIG. 23.
Figure 26:
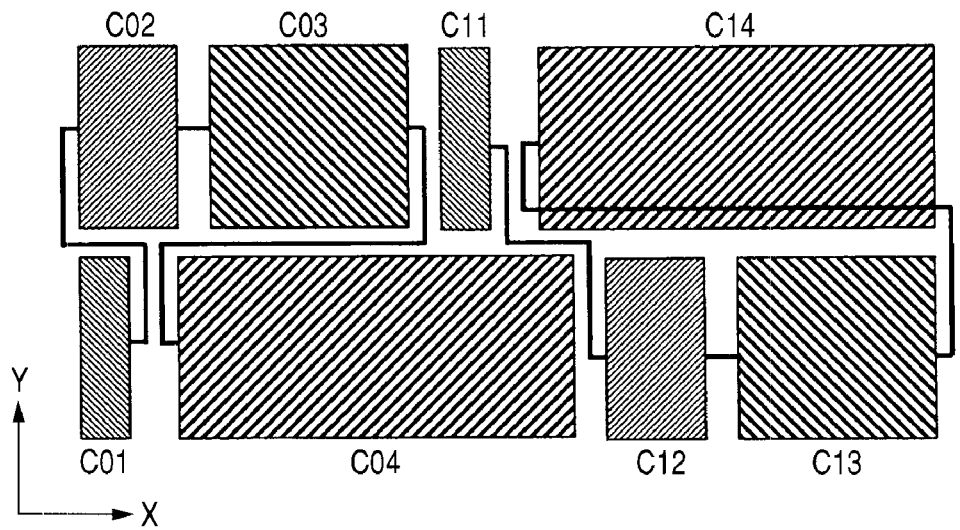
FIG. 26 is a schematic explanatory diagram of a layout state in the semiconductor integrated circuit illustrated in FIG. 23.

FIG. 23 shows another layout example of the semiconductor integrated circuit 10 according to the invention. FIG. 24 is a cross section taken along line I-I' in FIG. 23. FIG. 25 is a cross section taken along line J-J' in FIG. 23. FIG. 26 schematically shows a layout state of cells in the semiconductor integrated circuit 10 illustrated in FIG. 23. The semiconductor integrated circuit 10 shown in FIG. 23 includes a plurality of inverters C01 to C04 and C11 to C14. The semiconductor integrated circuit 10 shown in FIG. 23 largely differs from that shown in FIG. 18 with respect to the layout of the inverters. As obviously understood from comparison between FIGS. 21 and 26, the layout positions of the inverters C12 and C13 are interchanged, and the layout positions of the inverters C11 and C14 are interchanged. In the configuration shown in FIG. 23, a part of the inverter C04 faces one gate in the inverter C11 and one gate in the inverter C14.

Figure 27:
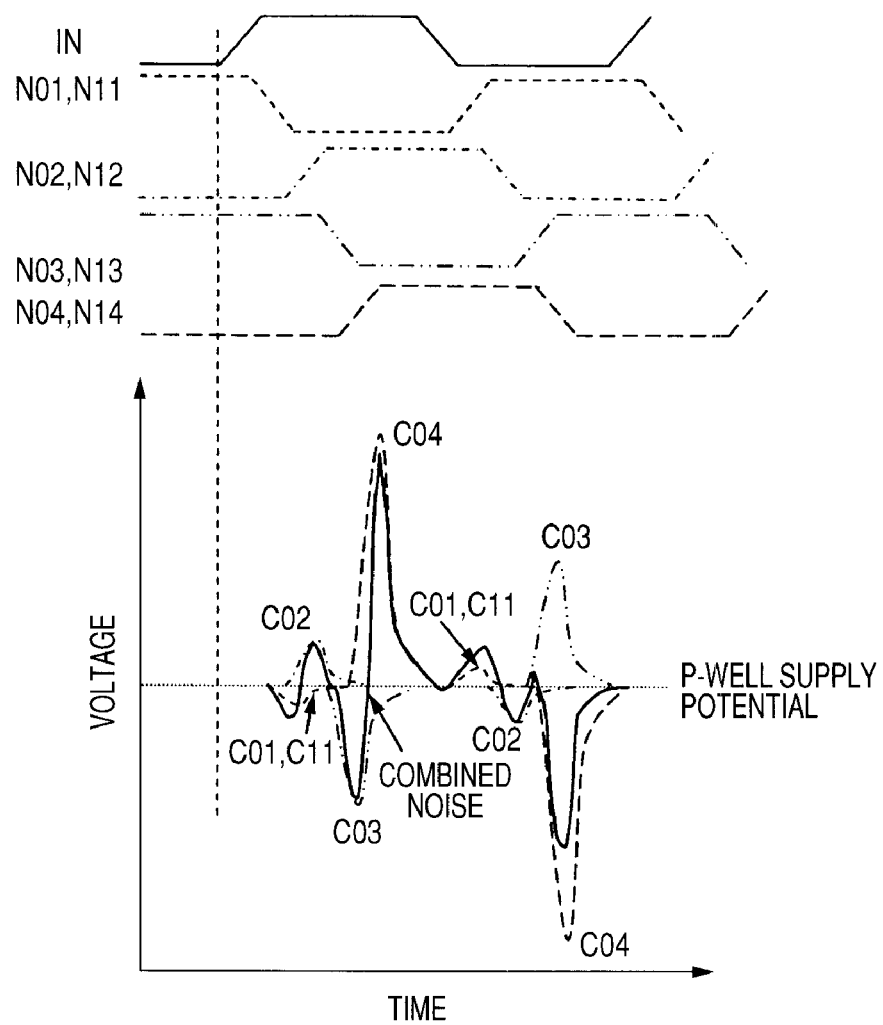
FIG. 27 is a waveform chart of input/output signals and well potential fluctuations in the semiconductor integrated circuit shown in FIG. 23.

FIG. 27 shows the relation between input/output signals and well potential fluctuations in the semiconductor integrated circuit shown in FIG. 23.

Although the well noise occurring in the inverter C11 interferes with the well noise occurring in the inverter C04, the well noise occurrence timing is the same as that of well noise in C01 and the phases are the same, so that the well noise in the inverter C01 increases. The well noise occurring in the inverter C14 interfering with the well noise in the inverter C04 corresponds to one gate and, further, the position is close to a feed tap, so that interference of well noise hardly occurs. Consequently, the maximum value of the well noises combined in the well is smaller than well noise occurring in the inverter C04. The chip area in the embodiment is equal to that of the circuit shown in FIG. 18 and is smaller than the chip area of the circuit shown in FIG. 1. The maximum value of the well noise is smaller than the well noise of the inverter C04 which is the maximum of single noises in a cell.

In the fifth embodiment, attention is paid only to the n-channel-type MOS transistors. By applying the method to the p-channel-type MOS transistors constructing the inverters, an effect similar to the reduction in the well noise can be also obtained. In the case where the layout of the third embodiment cannot be applied simultaneously to the n-channel-type MOS transistors and the p-channel-type MOS transistors when a plurality of blocks are arranged in the column direction, the layout of the fifth embodiment may be applied to the transistors having a higher well resistance value.

Although inverters are taken as an example in the embodiment like in the case of FIG. 12A, similar effects can be also obtained in the case where output signals of circuits other than inverters are complementary. The embodiment is not limited to the inverter chain. The effect of reducing the well noise is also produced in circuits disposed adjacent to each other, to which inputs are independent of each other and in which signals are complementary.

In the fifth embodiment, an inverter chain is disposed for an inverter chain in a line-symmetrical manner so that the difference of numbers of gates disposed in the P wells WP1 and WP2 becomes small.

Also in the fifth embodiment, the difference of numbers of gates disposed in the P wells WP1 and WP2 is smaller than that in the third embodiment, so that the layout area can be reduced.

Sixth Embodiment

A sixth embodiment will be described.

Figure 28:
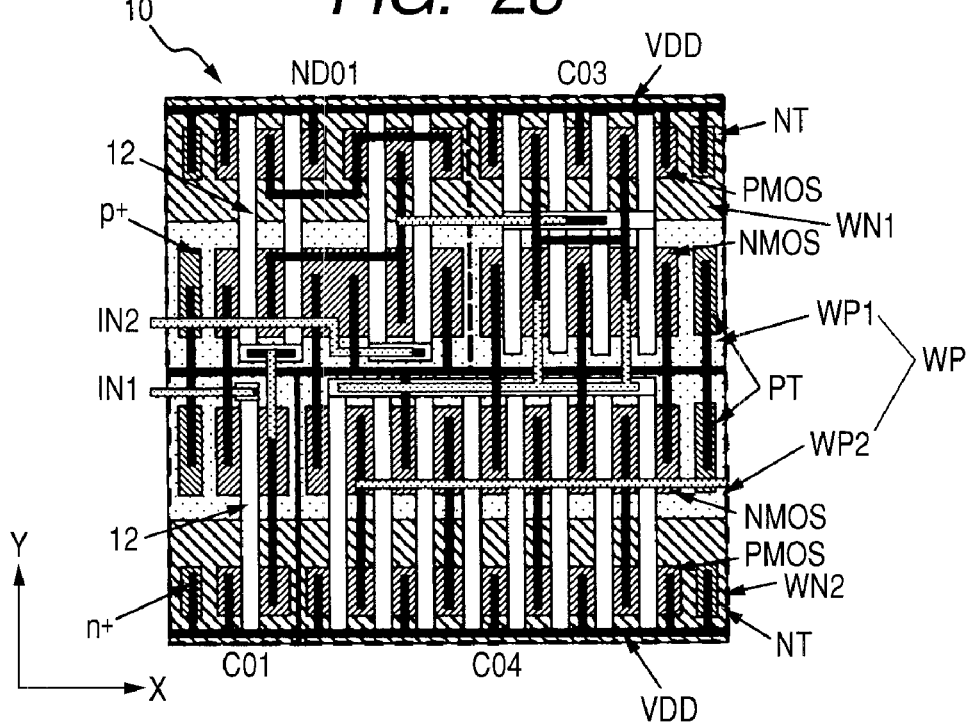
FIG. 28 is a plan view showing another layout example of the semiconductor integrated circuit according to the present invention.
Figure 29:
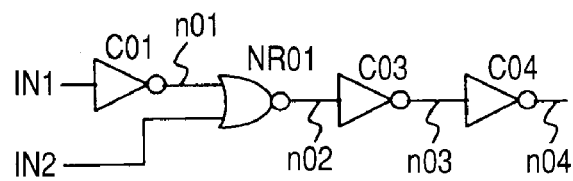
FIG. 29 is an equivalent circuit diagram of the semiconductor integrated circuit shown in FIG. 28.
Figure 30:
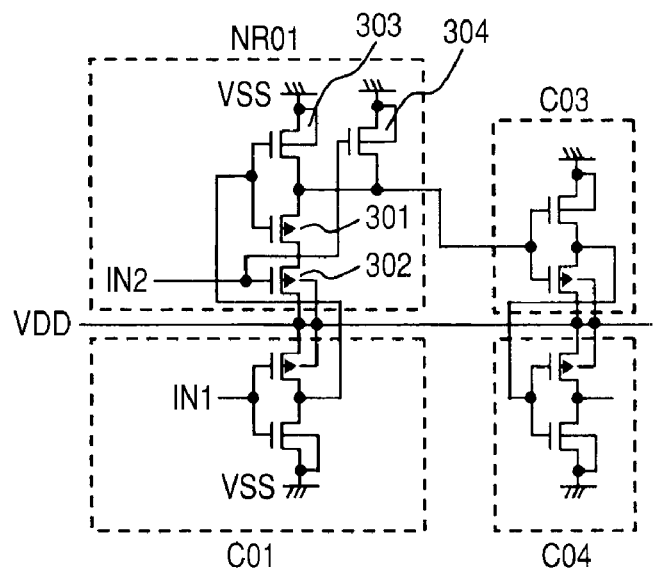
FIG. 30 is an equivalent circuit diagram of a MOS transistor level of the semiconductor integrated circuit shown in FIG. 28.
Figure 31:
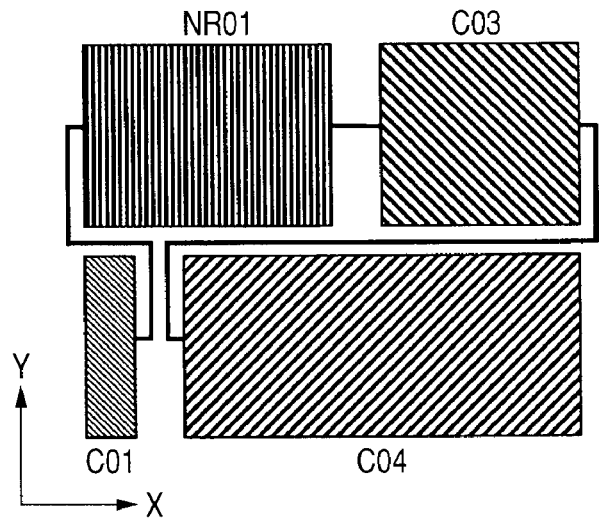
FIG. 31 is a schematic explanatory diagram of a layout state in the semiconductor integrated circuit illustrated in FIG. 28.

FIG. 28 shows another layout example of the semiconductor integrated circuit 10 according to the invention. FIG. 29 shows an equivalent circuit of the semiconductor integrated circuit 10 shown in FIG. 28. FIG. 30 shows an equivalent circuit of a MOS transistor level of the semiconductor integrated circuit 10 shown in FIG. 28. FIG. 31 schematically shows a layout state of cells in the semiconductor integrated circuit 10 illustrated in FIG. 28.

The semiconductor integrated circuit 10 shown in FIG. 28 largely differs from that shown in FIG. 7 and the like with respect to the point that a NOR gate is included in a logic circuit group. Specifically, the logic of the input signal IN1 is inverted by the inverter C01, the NOR logic between an output signal n01 of the inverter C01 and the input signal IN2 is obtained by a NOR gate NR01, and an output signal of the NOR gate NR01 is transmitted to the inverter C03 at the post stage. As the NOR gate NR01, as shown in FIG. 30, a known circuit formed by coupling two p-channel-type MOS transistors 301 and 302 and two n-channel-type MOS transistors 303 and 304 can be applied.

Figure 32:
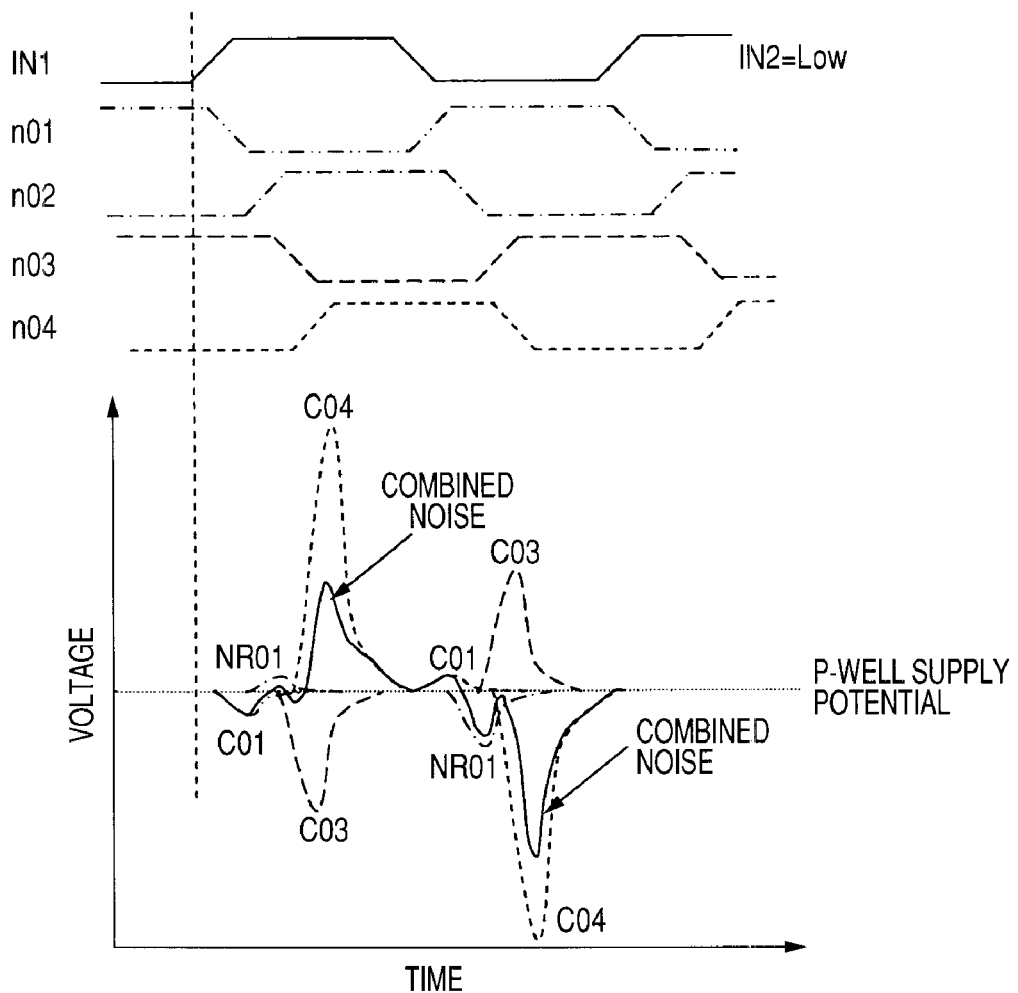
FIG. 32 is a waveform chart of input/output signals and well potential fluctuations in the semiconductor integrated circuit shown in FIG. 28.

FIG. 32 shows the relation between input/output signals and well potential fluctuations in the semiconductor integrated circuit shown in FIG. 28.

When the input signal IN2 of the NOR gate NR01 becomes the high level, the potential of the output signal n02 and after that is fixed to a DC (direct current) potential level. The embodiment will be described on assumption that the noise potential generated in the well region becomes the maximum and using the case where the input signal IN2 is at the low level as a condition.

The input signal IN2 is fixed to the low level, and the other input signal IN1 is set as a signal which is synchronized with clocks. Inversion is repeated in the output signals n01 to n04. The positive and negative potentials using the P well supply potential are included also in a noise component generated in the well WP. As a result, the well noises in the inverter C01 and the NOR gate NR01 cancel each other. Similarly, the well noises in the NOR gate NR01 and the inverter C03 cancel each other. The well noises in the inverter C03 and the inverter C04 cancel each other. As the gate size in the circuits increases toward a latter stage, the size of the well noise increases toward a latter stage. The combined well noise is smaller than the well noise which occurs in the single inverter C04. In the embodiment, even if a NOR gate exists in the layout configuration of circuits sandwiched by feed taps, by setting output signals of circuits disposed adjacent to each other to a complementary level, the well noise can be suppressed. In addition, in a manner similar to the case of the semiconductor integrated circuit shown in FIG. 1, the number of feed taps can be reduced. Therefore, effects similar to those of the semiconductor integrated circuit shown in FIG. 1 and the like can be obtained.

In the sixth embodiment, in a manner similar to the case shown in FIG. 12A, attention is paid only to the n-channeltype MOS transistors. By applying the method to the p-channel-type MOS transistors constructing inverters, similar effects are obtained.

When the method cannot be applied simultaneously to the n-channel-type MOS transistors and the p-channel-type MOS transistors, the method may be applied to the transistors having a higher well resistance value.

Also in the case of replacing the inverters as an example of the circuits with circuits other than inverters, whose outputs are complementary, the above-described effects are obtained.

In the sixth embodiment, the NOR gate NR01 is inserted at the second inverter chain. However, the invention is not limited to the configuration and the NOR gate NR01 may be inserted in any stage. Also in the case where a plurality of NOR gates are disposed, effects similar to the above can be obtained.

When two inverter chains are used in the embodiment, similar effects are obtained also in the case of using the larger number of inverter chains.

Although the number of circuit stages is four in the embodiment, the above-described effects are obtained also in the case of another number of stages.

In the embodiment, the gate size of a MOS transistor forming a logic circuit is increased toward a latter stage. When output signals of circuits disposed adjacent to each other have the relation of a complementary level regardless of the gate size, it is effective to reduce well noise.

Seventh Embodiment

A seventh embodiment will be described.

Figure 33:
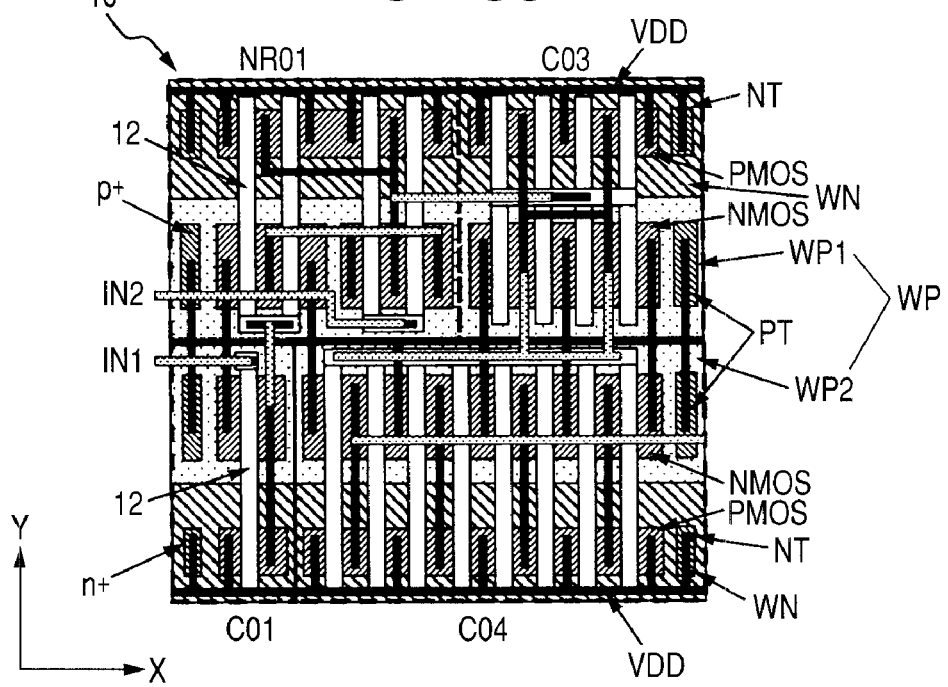
FIG. 33 is a plan view showing another layout example of the semiconductor integrated circuit according to the present invention.
Figure 34:
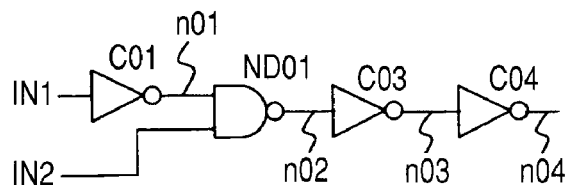
FIG. 34 is an equivalent circuit diagram of the semiconductor integrated circuit shown in FIG. 33.
Figure 35:
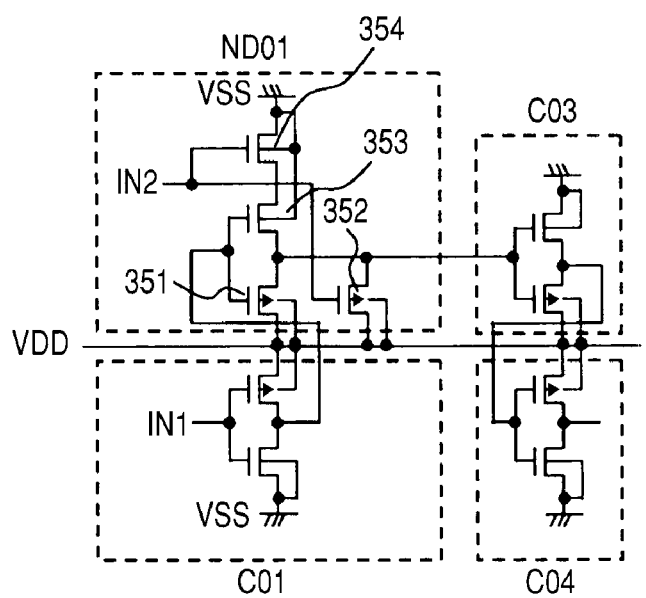
FIG. 35 is an equivalent circuit diagram of a MOS transistor level of the semiconductor integrated circuit shown in FIG. 33.
Figure 36:
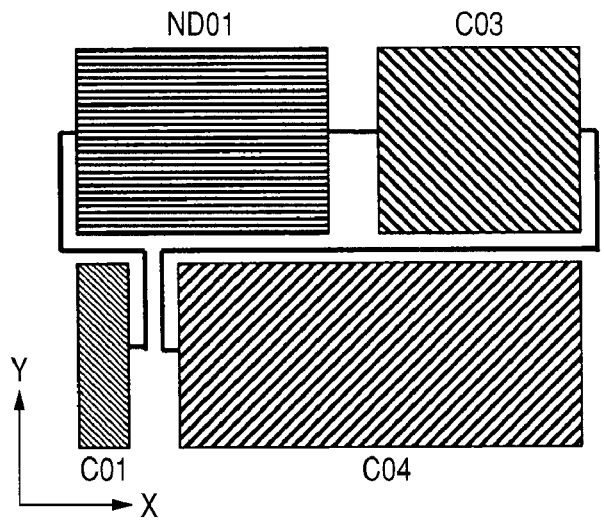
FIG. 36 is a schematic explanatory diagram of a layout state in the semiconductor integrated circuit illustrated in FIG. 33.

FIG. 33 shows another layout example of the semiconductor integrated circuit 10 according to the invention. FIG. 34 shows an equivalent circuit of the semiconductor integrated circuit 10 shown in FIG. 33. FIG. 35 shows an equivalent circuit of a MOS transistor level of the semiconductor integrated circuit 10 shown in FIG. 33. FIG. 36 schematically shows a layout state of cells in the semiconductor integrated circuit 10 illustrated in FIG. 33.

The semiconductor integrated circuit 10 shown in FIG. 33 largely differs from that shown in FIG. 28 with respect to the point that a NAND gate is included in place of a NOR gate. Specifically, the logic of the input signal IN1 is inverted by the inverter C01, the NAND logic between the output signal n01 of the inverter C01 and the input signal IN2 is obtained by a NAND gate ND01, and an output signal of the NAND gate ND01 is transmitted to the inverter C03 at the post stage. As the NAND gate ND01, as shown in FIG. 35, a known circuit formed by coupling two p-channel-type MOS transistors 351 and 352 and two n-channel-type MOS transistors 353 and 354 can be applied.

Figure 37:
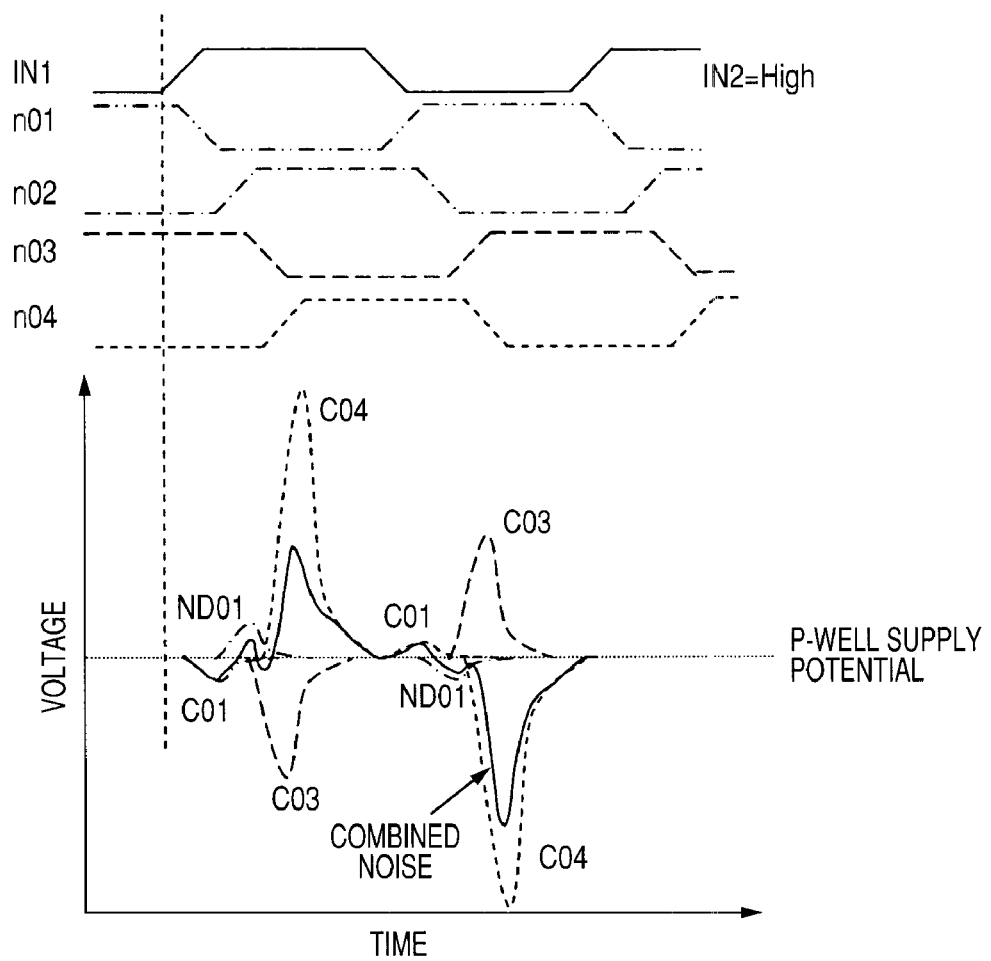
FIG. 37 is a waveform chart of input/output signals and well potential fluctuations in the semiconductor integrated circuit shown in FIG. 33.

FIG. 37 shows the relation between input/output signals and well potential fluctuations in the semiconductor integrated circuit shown in FIG. 33.

In the embodiment, the case where the noise potential generated in the well region becomes the maximum and the input signal IN2 is at the high level is assumed. The effects of the embodiment are similar to those of the case of the semiconductor integrated circuit shown in FIG. 28 except for the point that the NAND logic is obtained by the NAND gate ND01. Thus, the well noise can be reduced and the number of feed taps can be decreased.

In the seventh embodiment, in a manner similar to the case shown in FIG. 12A, attention is paid only to the n-channel-type MOS transistors. By applying the method to the p-channel-type MOS transistors constructing inverters, similar effects are obtained.

When the method cannot be applied simultaneously to the n-channel-type MOS transistors and the p-channel-type MOS transistors, the method may be applied to the transistors having a higher well resistance value.

Also in the case of replacing the inverters as an example of the circuits in the embodiment with circuits other than inverters, whose outputs are complementary, the above-described effects are obtained.

In the seventh embodiment, the NAND gate ND01 is inserted at the second inverter chain. However, the invention is not limited to the configuration and the NAND gate ND01 may be inserted in any stage. Also in the case where a plurality of NAND gates are disposed, effects similar to the above are obtained.

Although two inverter chains are used as an example in the embodiment, similar effects are obtained also in the case of using the other number of inverter chains.

Although the number of circuit stages is four in the embodiment, the above-described effects are obtained also in the case of another number of stages.

In the embodiment, a combination of a NAND gate and an inverter is disposed. Also in the case of disposing a combination of a NOR gate or another logic circuit and an inverter, as long as output signals of circuits disposed adjacent to each other are complementary, well noise can be reduced.

In the embodiment, the gate size is increased toward a latter stage. However, irrespective of the size of the gate size, as long as output signals of circuits disposed adjacent to each other are complementary, it is effective to reduce well noise.

Eighth Embodiment

An eighth embodiment will be described.

Figure 38:
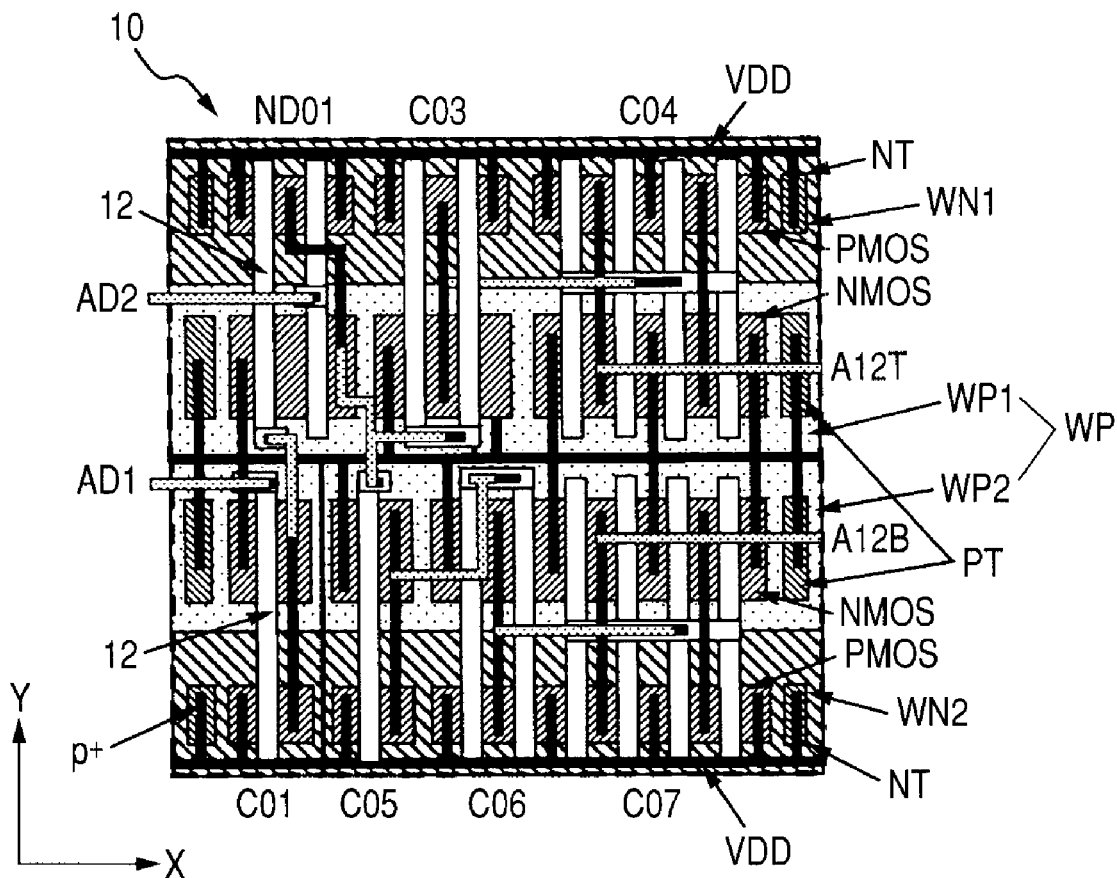
FIG. 38 is a plan view showing another layout example of the semiconductor integrated circuit according to the present invention.
Figure 39:
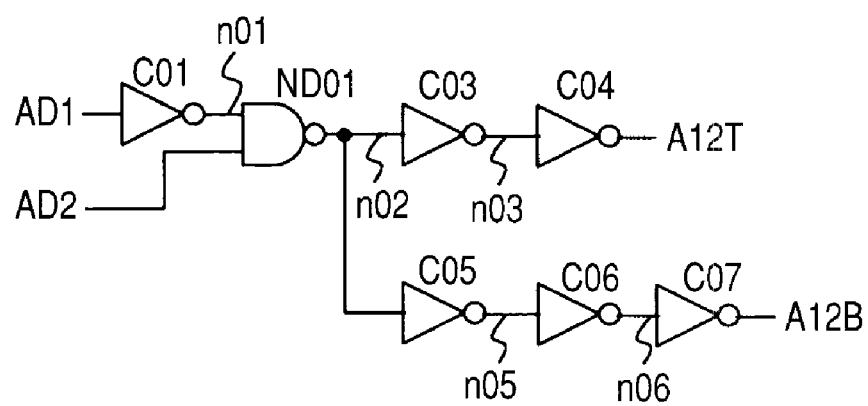
FIG. 39 is an equivalent circuit diagram of the semiconductor integrated circuit shown in FIG. 38.
Figure 40:
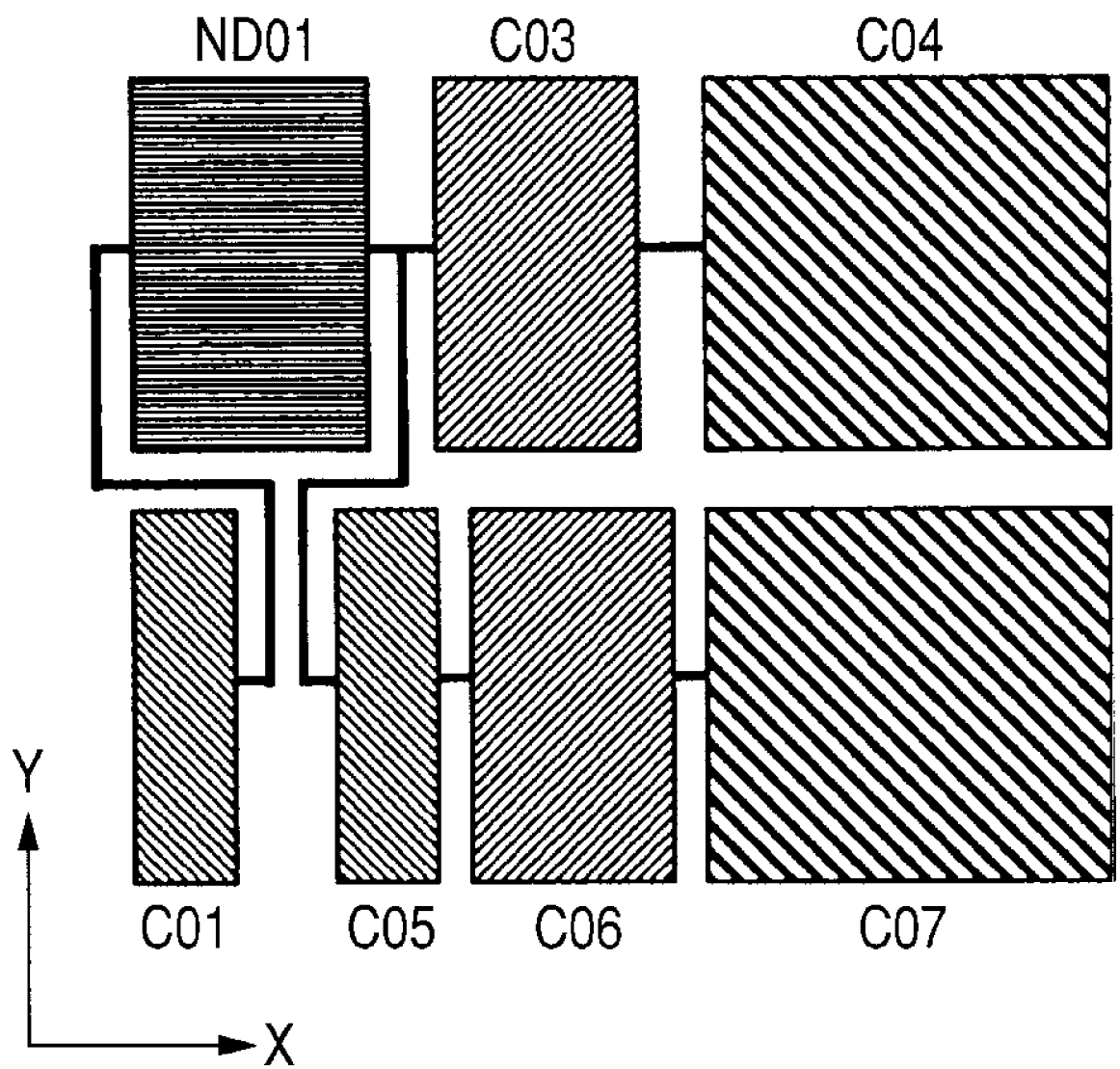
FIG. 40 is a schematic explanatory diagram of a layout state in the semiconductor integrated circuit illustrated in FIG. 38.

FIG. 38 shows another layout example of the semiconductor integrated circuit 10 according to the invention. FIG. 39 shows a logic circuit included in the semiconductor integrated circuit 10 illustrated in FIG. 38. FIG. 40 schematically shows a layout state of cells in the semiconductor integrated circuit 10 illustrated in FIG. 38.

The semiconductor integrated circuit 10 shown in FIG. 38 largely differs from that shown in FIG. 33 with respect to the point that, by adding inverters C05, C06, and C07, an address decode buffer capable of decoding address signals AD1 and AD2 and outputting a signal of a complementary level is formed. A decode output signal A12T is obtained from the inverter C04, and a decode output signal A12B of a complementary level with the decode output signal A12T is obtained from the inverter C07.

Also in the eighth embodiment, by disposing a circuit for generating an output signal which is complementary with an output signal of a target circuit so as to be adjacent to the target circuit, well noise can be suppressed. Even when a circuit disposed adjacent to the target circuit is not a circuit at the next stage, if an output signal of the adjacent circuit is complementary with an output of the target circuit, well noise can be suppressed.

Cells are disposed so as to be adjacent to each other so that output signals are complementary. Only the inverters C03 and C05 are disposed so as to be adjacent to each other at the relation that output signals have the same phase (which rise and trail at the same timings).

Figure 41:
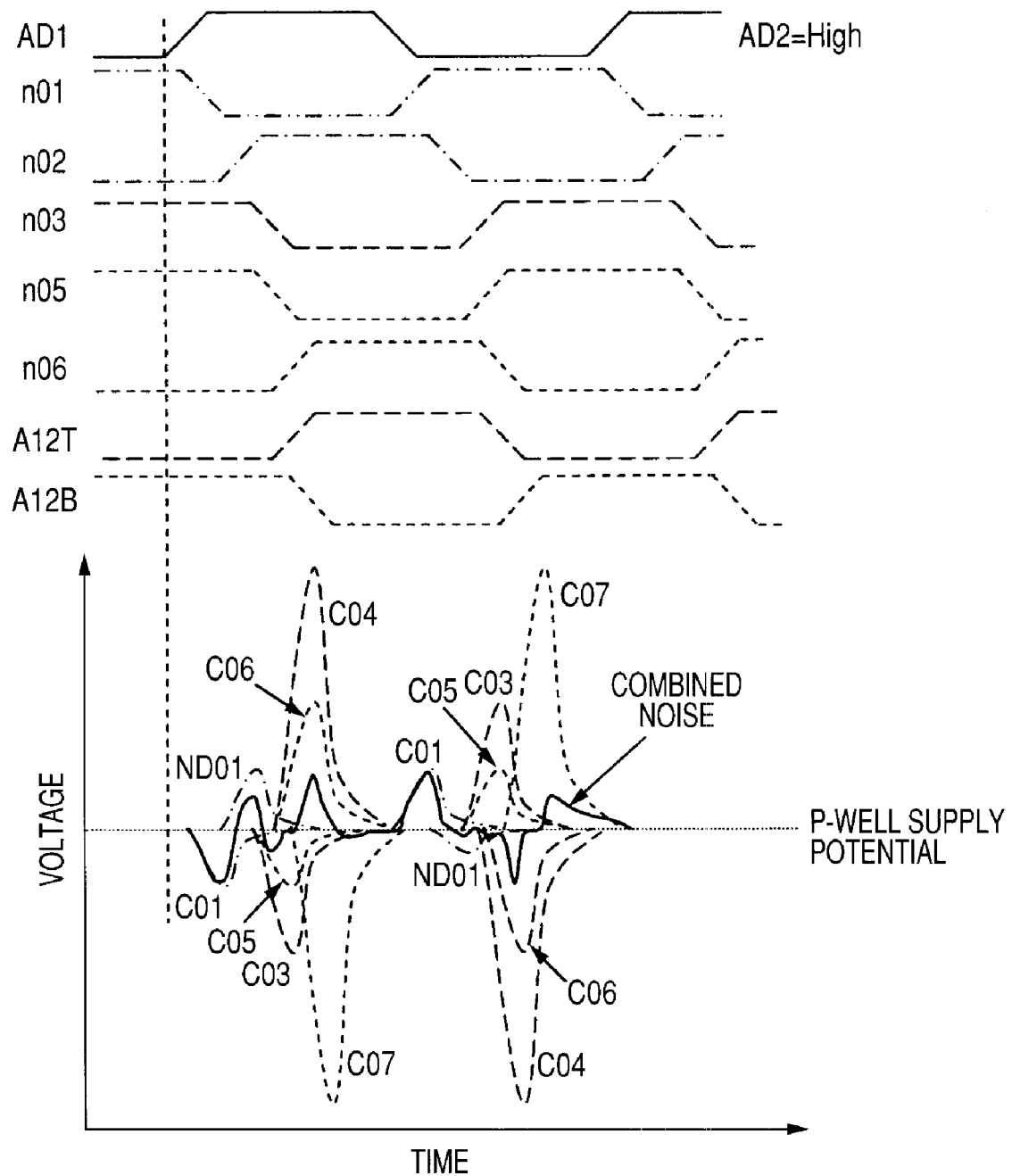
FIG. 41 is a waveform chart of input/output signals and well potential fluctuations in the semiconductor integrated circuit shown in FIG. 38.

FIG. 41 shows the relation between input/output signals and well potential fluctuations in the semiconductor integrated circuit shown in FIG. 38.

Since the gate size of the inverters C03 and C05 is relatively small, combined well noise is relatively small. To the inverters C03 and C05, a signal of the node n02 is branched and transmitted. Output signals of the inverters C06 and C03 and output signals of the inverters C07 and C04 at the post stages are complementary with each other, the inverters C06 and C03 are disposed so as to be adjacent to each other, and the inverters C07 and C04 are disposed so as to be adjacent to each other. The inverters C06 and C03 share the well. Consequently, in a manner similar to the case of the above example, well noise is suppressed.

In the eighth embodiment, in a manner similar to the case shown in FIG. 12A, attention is paid only to the n-channel-type MOS transistors. By applying the method to the p-channel-type MOS transistors constructing inverters, similar effects are obtained.

When the method cannot be applied simultaneously to the n-channel-type MOS transistors and the p-channel-type MOS transistors, the method may be applied to the transistors having a higher well resistance value.

In the eighth embodiment, inverters are used as an example. Also in the case of using circuits other than inverters, whose outputs are complementary, an effect of reducing well noise is produced.

Although an address decode buffer is used as an example in the embodiment, the above-described effects are obtained also in the case of disposing other circuits to which complementary signals are input.

Ninth Embodiment

A ninth embodiment will be described.

Figure 42:
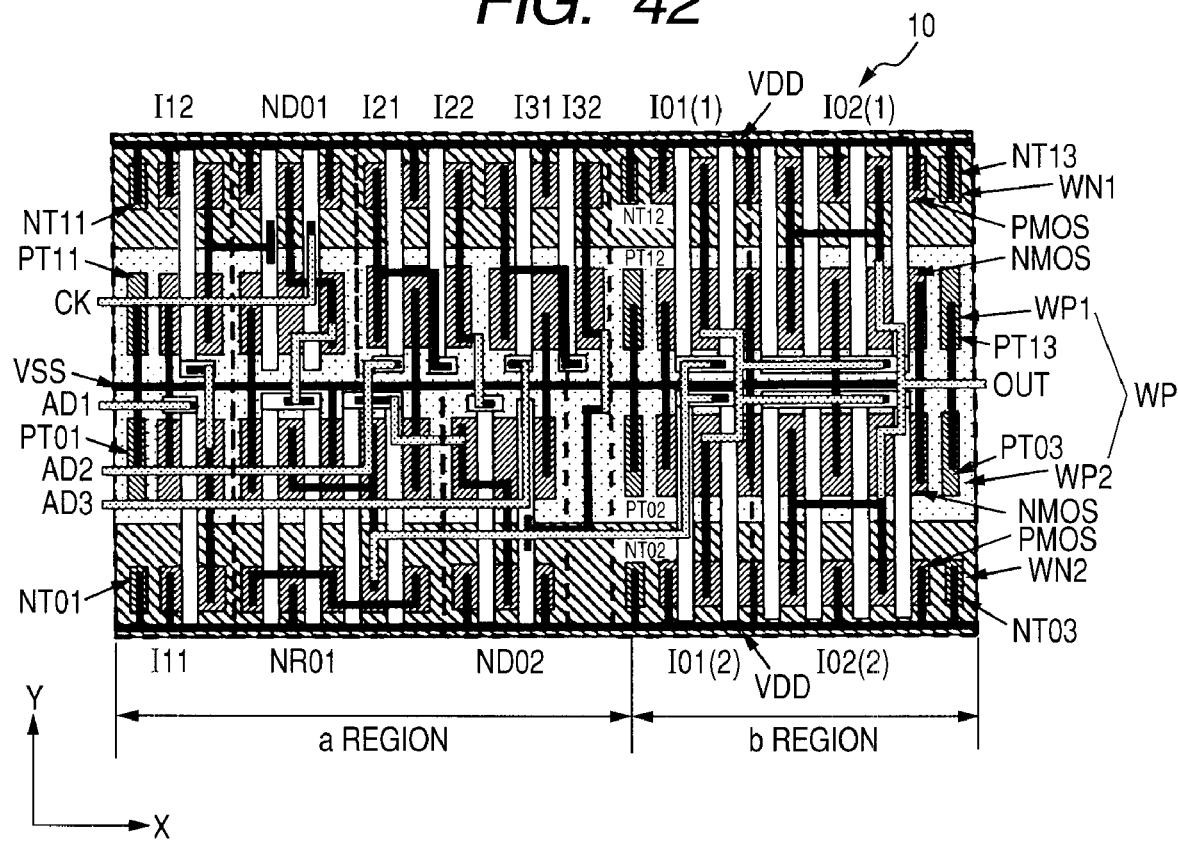
FIG. 42 is a plan view showing another layout example of the semiconductor integrated circuit according to the present invention.
Figure 43:
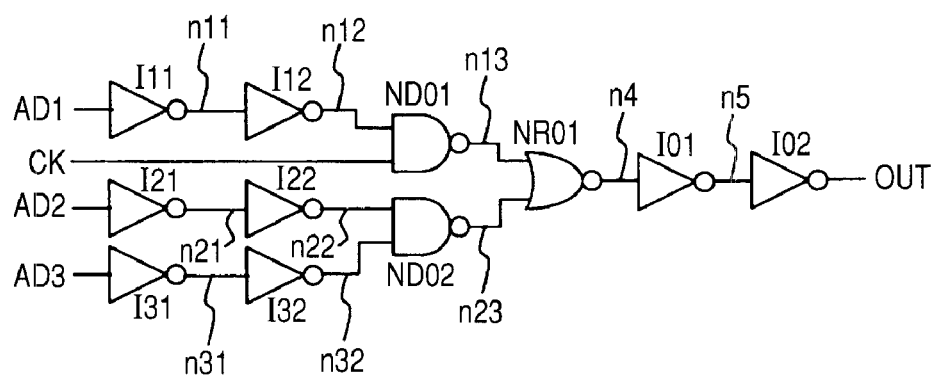
FIG. 43 is an equivalent circuit diagram of the semiconductor integrated circuit shown in FIG. 42.
Figure 44:
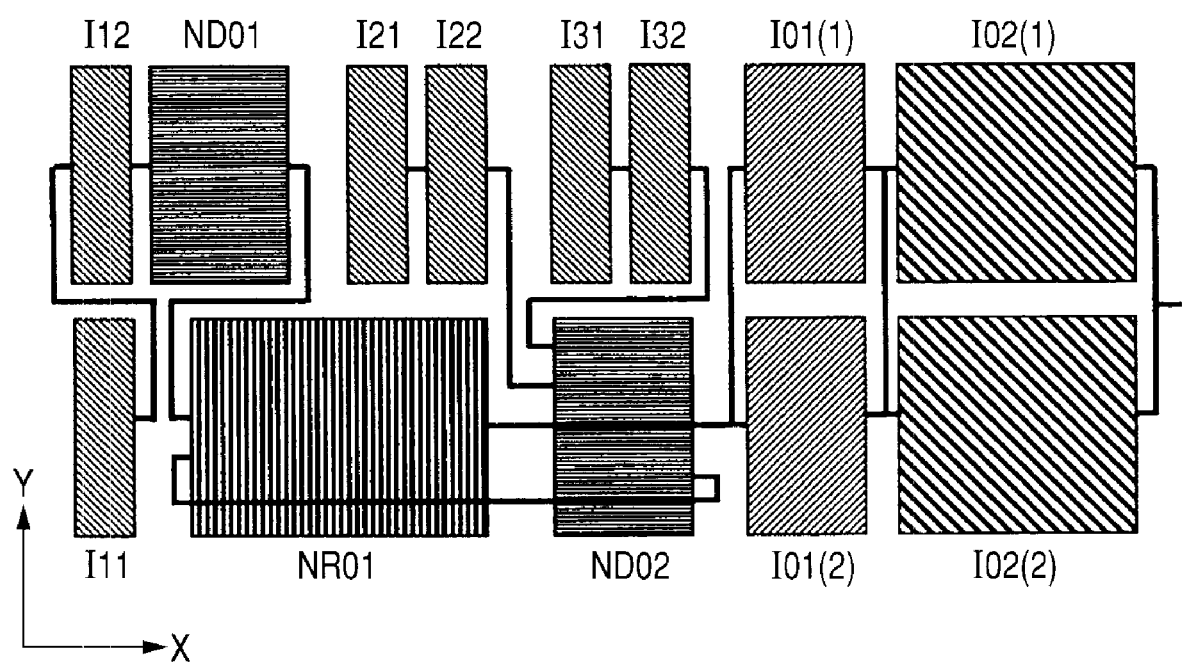
FIG. 44 is a schematic explanatory diagram of a layout state in the semiconductor integrated circuit illustrated in FIG. 42.

FIG. 42 shows another layout example of the semiconductor integrated circuit 10 according to the invention. FIG. 43 shows an equivalent circuit of the semiconductor integrated circuit 10 illustrated in FIG. 42. FIG. 44 schematically shows a layout state of cells in the semiconductor integrated circuit 10 illustrated in FIG. 42.

The semiconductor integrated circuit 10 shown in FIG. 42 largely differs from that shown in FIG. 38 with respect to the point that a decoder for decoding an input address signal is formed.

In the semiconductor integrated circuit 10 shown in FIG. 42, by disposing a circuit for generating an output signal which is complementary with an output signal of a target circuit so as to be adjacent to the target circuit, noise occurring in the well region can be suppressed. As shown in FIG. 42, the inverters I11 and I12, the NAND gate ND01, and the NOR gate NR01 are disposed adjacent to each other. Output signals of neighboring circuits are complementary with each other. Similarly, inverters I21, I22, I31, and I32 are disposed so as to be adjacent to each other, and the NAND gates ND02 and the NOR gate NR01 are disposed so as to be adjacent to each other. Since output signals of the cells disposed adjacent to each other have a complementary level, noise occurring in the well region is suppressed. Although an output signal of the inverter I22 and an output signal of the NOR gate NR01 have the same phase, since there is a delay time difference in well noise occurrence timings, noises are not combined. Similarly, an output signal of the inverter I31 and an output signal of the NAND gate ND02 have the same phase. However, since there is a delay time difference in well noise occurrence timings, noises are not combined.

The cells are in a region sandwiched by feed taps and belong to the "a" region. The inverters I01 and I02 output signals complementary with each other, are in adjacent regions, and belong to the "b" region. The inverters I01 and I02 are in an output stage. By coupling circuits having the same logic in parallel as partitioned by (1) and (2), the drivability is increased.

Figure 45:
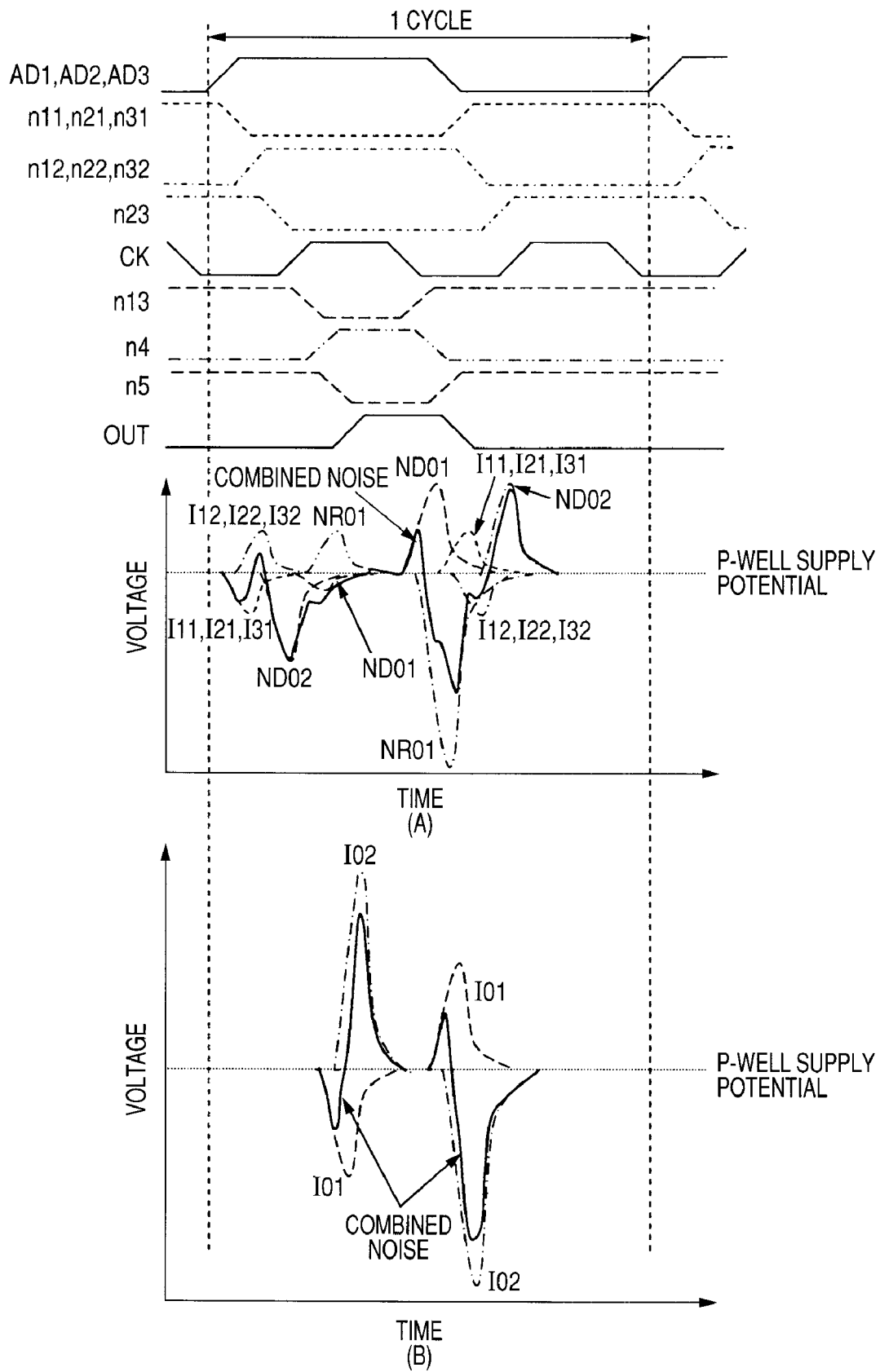
FIG. 45 is a waveform chart of input/output signals and well potential fluctuations in the semiconductor integrated circuit shown in FIG. 42.

FIG. 45 shows the relation between input/output signals and well potential fluctuations in the semiconductor integrated circuit shown in FIG. 42. FIG. 45A shows noises in the P well in the "a" region in the semiconductor integrated circuit illustrated in FIG. 42. FIG. 45B shows noises in the P well in the "b" region in the semiconductor integrated circuit illustrated in FIG. 42.

Well noises occurring in the MOS transistors occur in circuits of positive and negative potentials adjacent to each other. Since the well noises cancel each other, the combined noise is smaller than well noise occurring in a single circuit. Since the number of gates between feed taps is five, the well resistance value between the taps of noise occurring in the "b" region becomes 5/8 of the case where eight gates are disposed. Since the circuits in the "b" region are an output buffer part and the gate size of the inverters is relatively large, by decreasing the well resistance, well noise is suppressed. Since output signals of the inverters I01 and I02 are complementary with each other, well noises occurring in the inverters I01 and I02 cancel each other.

In the ninth embodiment, attention is paid only to the n-channel-type MOS transistors. By applying the method to the p-channel-type MOS transistors constructing inverters, similar effects are obtained.

When the method cannot be applied simultaneously to the n-channel-type MOS transistors and the p-channel-type MOS transistors, the method may be applied to the transistors having a higher well resistance value.

Also in the case of using circuits other than inverters used in the embodiment, whose outputs are complementary, an effect of reducing well noise is produced.

Although four inverter chains are used in the embodiment, the above-described effects are obtained also in the case of using the other plural number of inverter chains.

Tenth Embodiment

A tenth embodiment will be described.

Figure 46:
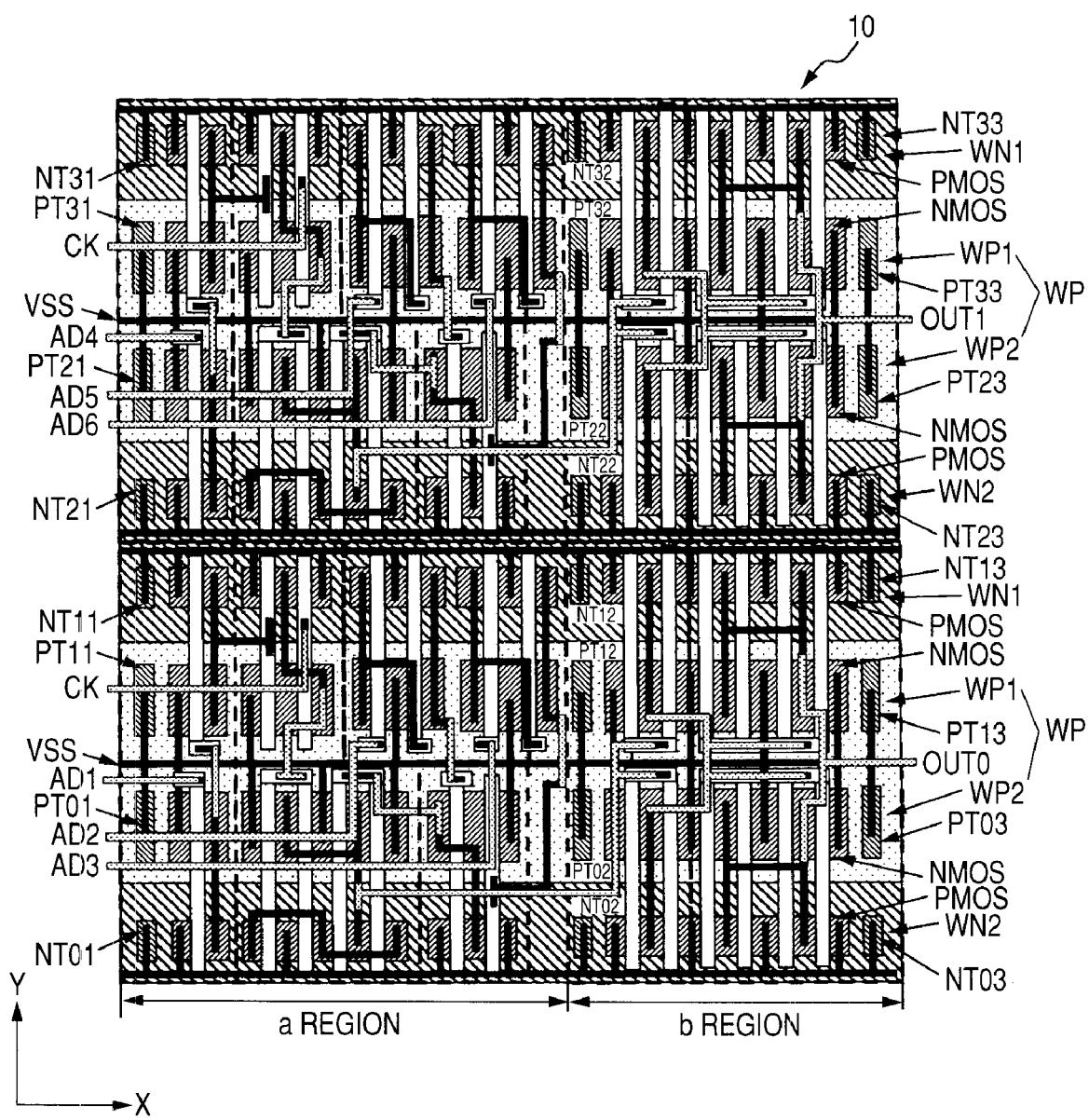
FIG. 46 is a plan view showing another layout example of the semiconductor integrated circuit according to the present invention.
Figure 47:
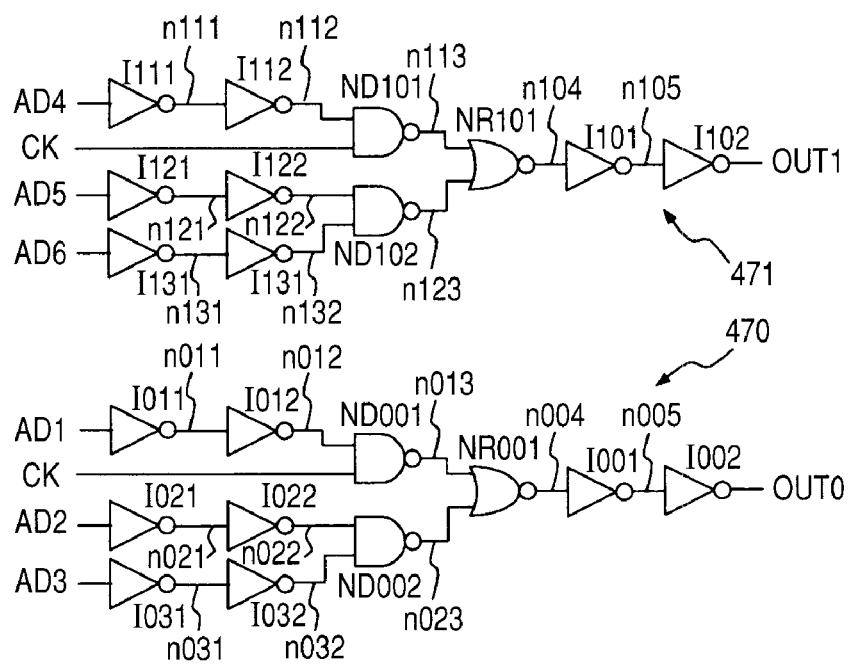
FIG. 47 is an equivalent circuit diagram of the semiconductor integrated circuit shown in FIG. 46.
Figure 48:
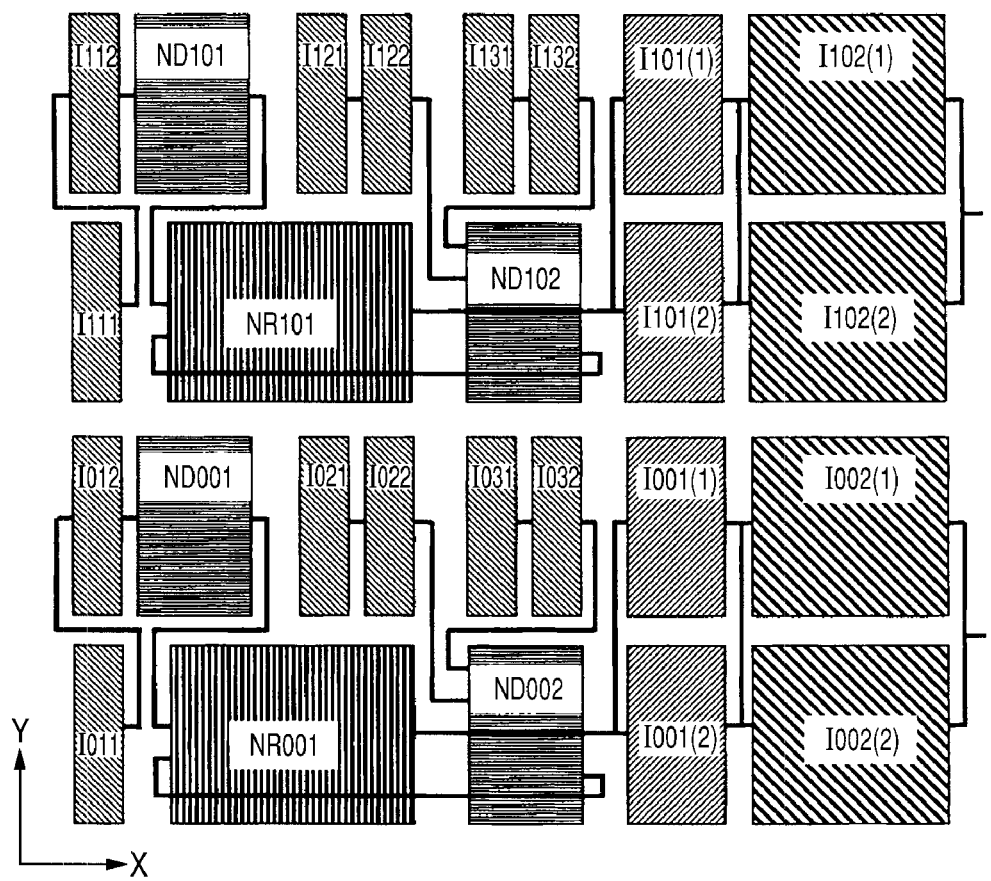
FIG. 48 is a schematic explanatory diagram of a layout state in the semiconductor integrated circuit illustrated in FIG. 47.

FIG. 46 shows another layout example of the semiconductor integrated circuit according to the invention. FIG. 47 shows an equivalent circuit of the semiconductor integrated circuit 10 illustrated in FIG. 46. FIG. 48 schematically shows a layout state of cells in the semiconductor integrated circuit illustrated in FIG. 46.

The semiconductor integrated circuit shown in FIG. 46 largely differs from that shown in FIG. 42 with respect to the point that two decoders shown in FIG. 42 are provided. The two decoders are disposed so as to be adjacent to each other along the Y axis. Since well noises of cells disposed in the P well are similar to those in the case of FIG. 42, the description will not be repeated. Only well noises occurring in the N well will be described.

Figure 49:
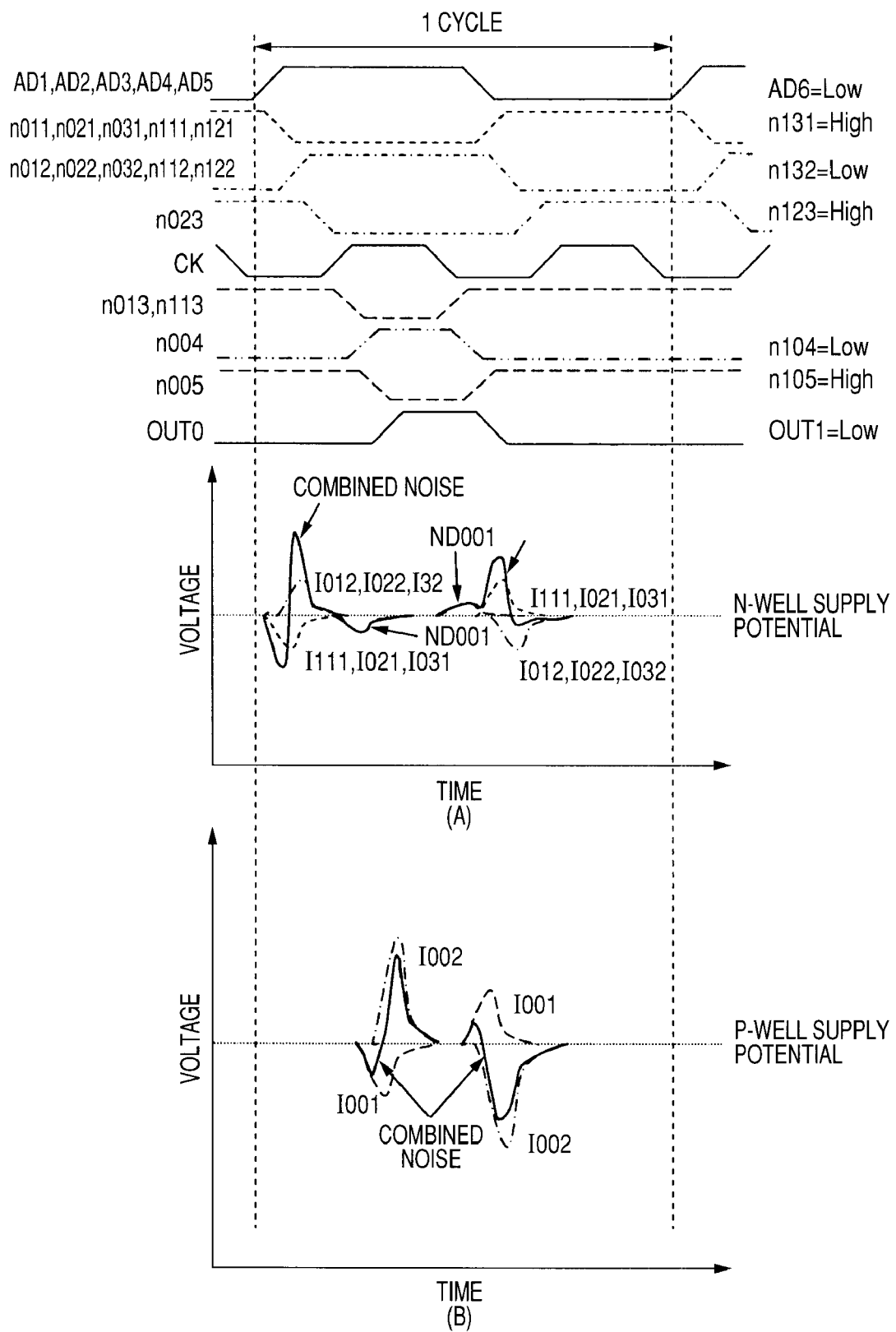
FIG. 49 is a waveform chart of input/output signals and well potential fluctuations in the semiconductor integrated circuit shown in FIG. 47.

FIG. 49 shows the relation between input/output signals and well potential fluctuations in the semiconductor integrated circuit shown in FIG. 46. FIG. 49A shows noises in the N well in the "a" region in the semiconductor integrated circuit illustrated in FIG. 46. FIG. 49B shows noises in the N well in the "b" region in the semiconductor integrated circuit illustrated in FIG. 46.

In the embodiment, a decoder 470 for decoding address signals AD1, AD2, and AD3 to obtain an output signal OUT0, and a decoder 471 for decoding address signals AD4, AD5, and AD6 to obtain an output signal OUT1 are disposed so as to be adjacent to each other. Well noises of circuits disposed in the N well occur in circuit operations. For example, in the case where the address signal AD6 is fixed to the low level, the output signal OUT1 is not selected. In the case where the address signals AD1 to AD5 are in transition, well noise occurs in an inverter I111 in the N well in which two blocks shown in FIG. 46 are commonly arranged. Inverters I111, I021, and I031 receive high-level signals at the same timing. As a result, although the well noises are tripled, the gate size of the first input stage is small, so that the well noises are in the permissible range. In the other circuits, signals satisfying the complementary level relation are output, so that well noises cancel each other. In the "b" region, the output buffer outputs a DC (Direct Current) level signal, so that no well noise occurs in the decoder 471. In the "b" region, N-well noise occurs only on the decoder 470 side.

Also in the case of replacing circuits taking the form of inverters and logic circuits in the embodiment with other circuits whose outputs are complementary, similar effects are obtained.

The decoders are taken as an example in the embodiment. Also with circuits having the other function, when the configuration method of the embodiment is used, by decreasing the number of taps, the chip area can be reduced.

Eleventh Embodiment

An eleventh embodiment will be described.

Figure 50:
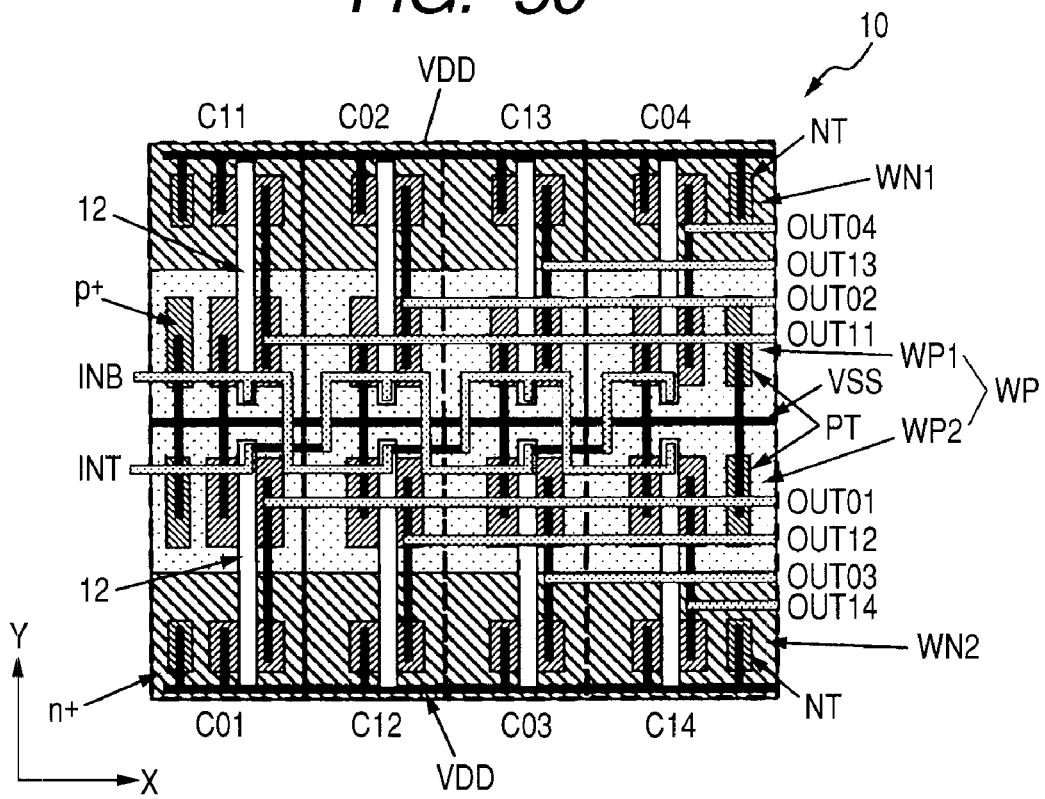
FIG. 50 is a plan view showing another layout example of the semiconductor integrated circuit according to the present invention.
Figure 51:
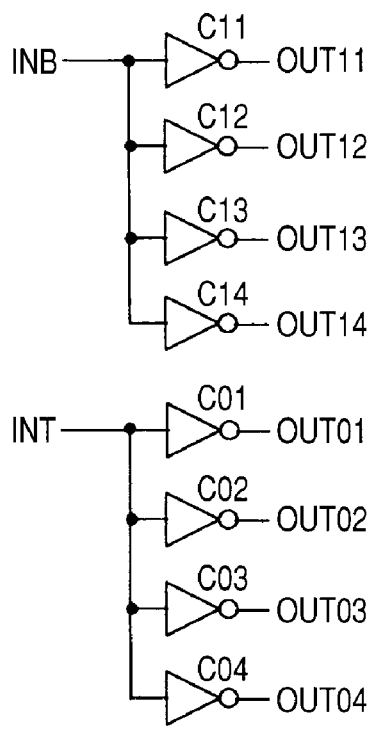
FIG. 51 is an equivalent circuit diagram of the semiconductor integrated circuit shown in FIG. 50.
Figure 52:
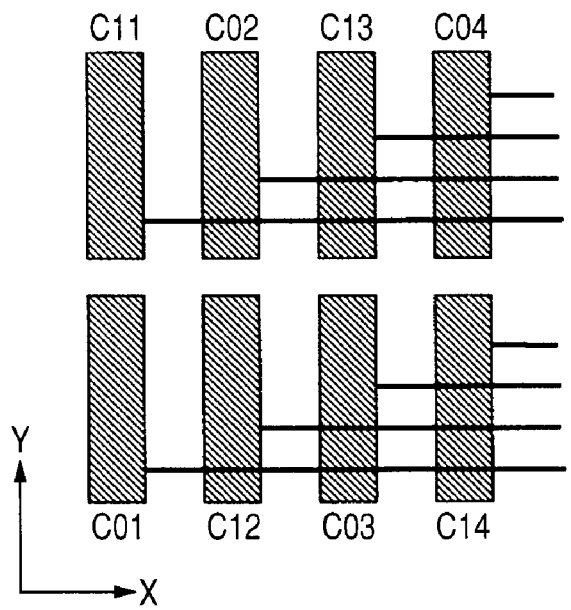
FIG. 52 is a schematic explanatory diagram of a layout state in the semiconductor integrated circuit illustrated in FIG. 50.

FIG. 50 shows another layout example of the semiconductor integrated circuit 10 according to the invention. FIG. 51 shows an equivalent circuit of the semiconductor integrated circuit 10 illustrated in FIG. 50. FIG. 52 schematically shows a layout state of cells in the semiconductor integrated circuit 10 illustrated in FIG. 50.

The semiconductor integrated circuit 10 shown in FIG. 50 largely differs from that shown in FIG. 1 with respect to the point that a plurality of inverters C01 to C04 to which an input signal INT is transmitted and a plurality of inverters C11 to C14 to which input signals INT and INB at the complementary level are transmitted are provided.

Figure 53:
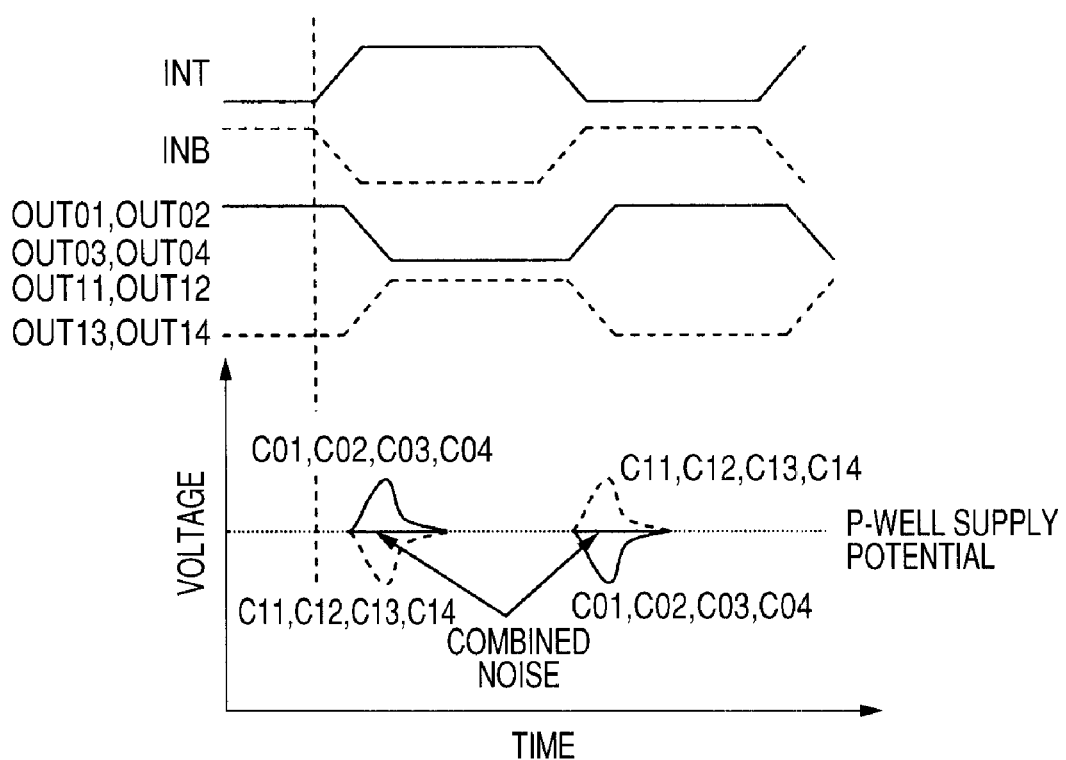
FIG. 53 is a waveform chart of input/output signals and well potential fluctuations in the semiconductor integrated circuit shown in FIG. 50.

FIG. 53 shows the relation between input/output signals and well potential fluctuations in the semiconductor integrated circuit 10 shown in FIG. 50.

In FIG. 53, INT and INB denote input signals of the complementary level, and OUT01 to OUT04 and OUT11 to OUT14 denote output signals. In the embodiment, well noises occurring in the inverters C01 to C04 and C11 to C14 are complementary with each other, so that combined noises are complementary and cancel each other. In the case where the gate size of each inverter and wire addition are almost the same as in the embodiment, the well noise becomes almost 0V.

Also in the case of replacing the inverters with other logic circuits, similar effects can be obtained.

Twelfth Embodiment

A twelfth embodiment will be described.

Figure 54:
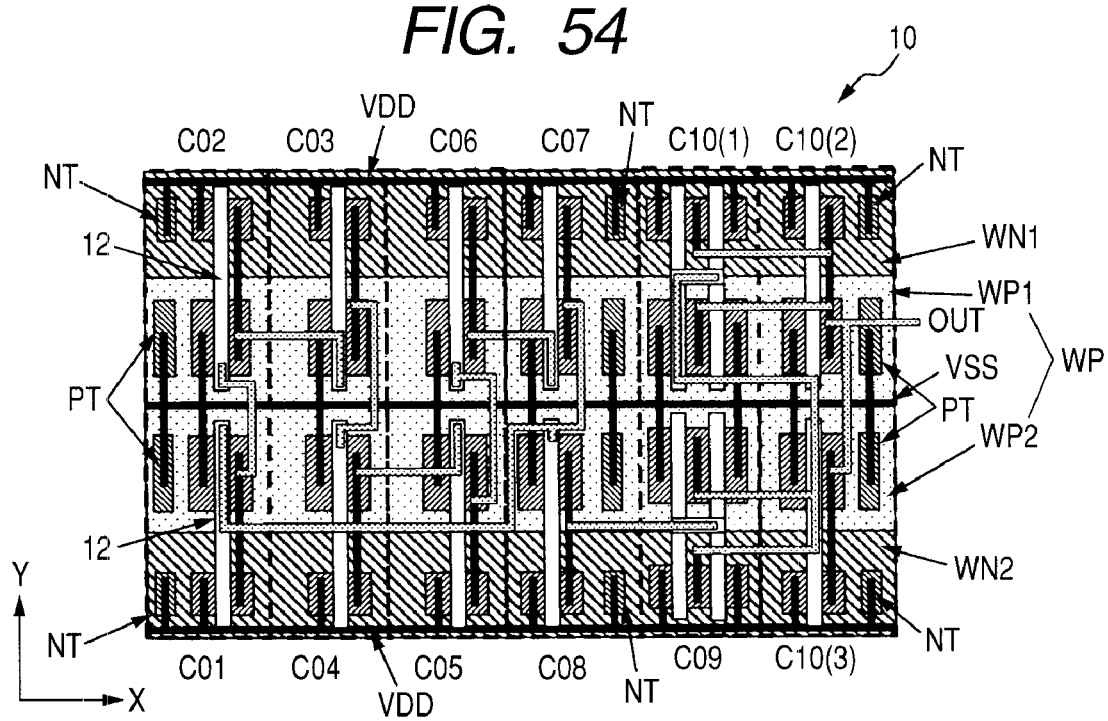
FIG. 54 is a plan view showing another layout example of the semiconductor integrated circuit according to the present invention.
Figure 55:
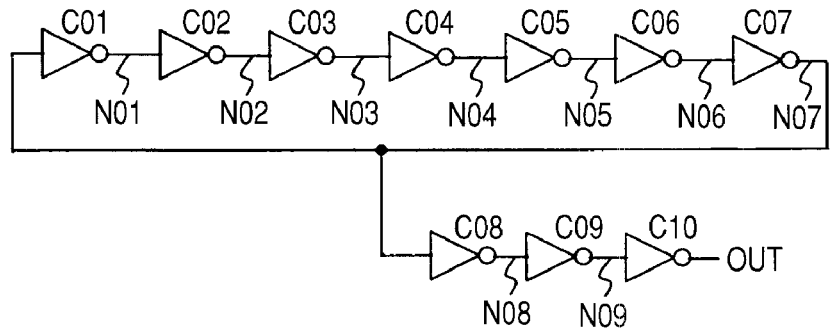
FIG. 55 is an equivalent circuit diagram of the semiconductor integrated circuit shown in FIG. 54.
Figure 56:
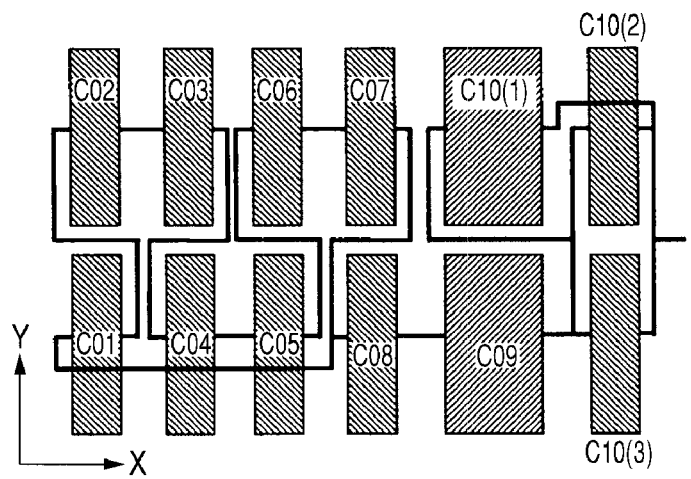
FIG. 56 is a schematic explanatory diagram of a layout state in the semiconductor integrated circuit illustrated in FIG. 54.

FIG. 54 shows another layout example of the semiconductor integrated circuit 10 according to the invention. FIG. 55 shows an equivalent circuit of the semiconductor integrated circuit 10 illustrated in FIG. 54. FIG. 56 schematically shows a layout state of cells in the semiconductor integrated circuit 10 illustrated in FIG. 54.

The semiconductor integrated circuit 10 shown in FIG. 54 largely differs from that shown in FIG. 1 with respect to the point that a ring oscillator is formed by a plurality of inverters.

In the embodiment, seven inverters C01 to C07 are cascade-coupled, and an output signal of the inverter C07 is fed back to the inverter C01. An output signal of the inverter C07 is output via a buffer formed by cascade-coupling the inverters C08 to C10.

Figure 57:
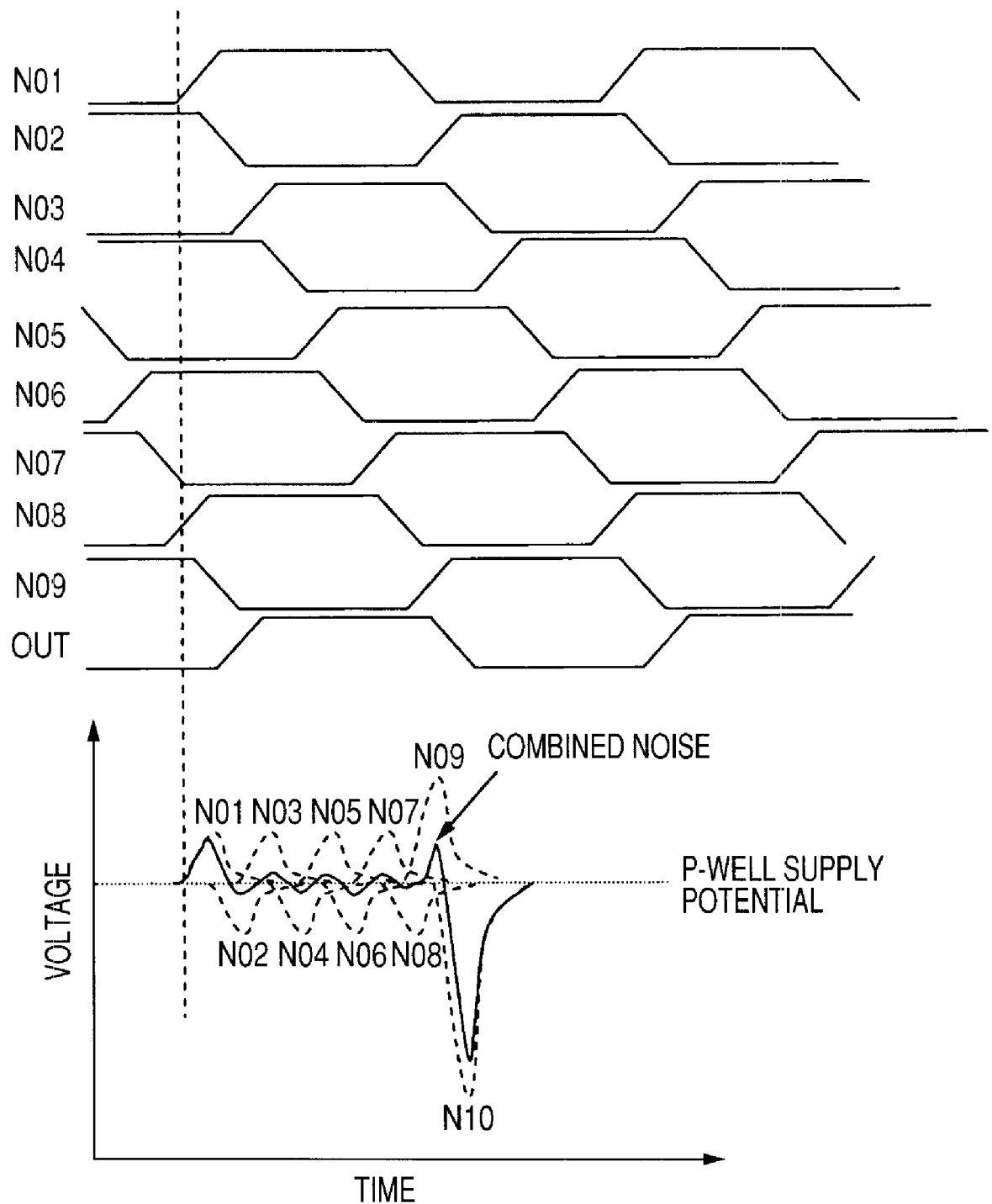
FIG. 57 is a waveform chart of input/output signals and well potential fluctuations in the semiconductor integrated circuit shown in FIG. 54.

FIG. 57 shows the relation between input/output signals and well potential fluctuations in the semiconductor integrated circuit shown in FIG. 54.

As shown in FIG. 57, in a ring-shaped inverter chain, by feedback of the signal, oscillation occurs. Inverters at ante- and post-stages are disposed so as to be adjacent to each of inverters constructing the ring oscillator. With the configuration, the sizes of MOS transistors constructing the inverters become equal to each other, and the well noise is reduced.

In an output buffer constructed by the inverters C08 to C10, the size of the MOS transistor of the inverter C09 is twice, and the size of the MOS transistor of the inverter C10 is four times. Accordingly, the well noise becomes twice and four times. However, the well noises cancel each other between cells disposed adjacent to each other, the noises are reduced.

Thirteenth Embodiment

A thirteenth embodiment will be described.

Figure 58:
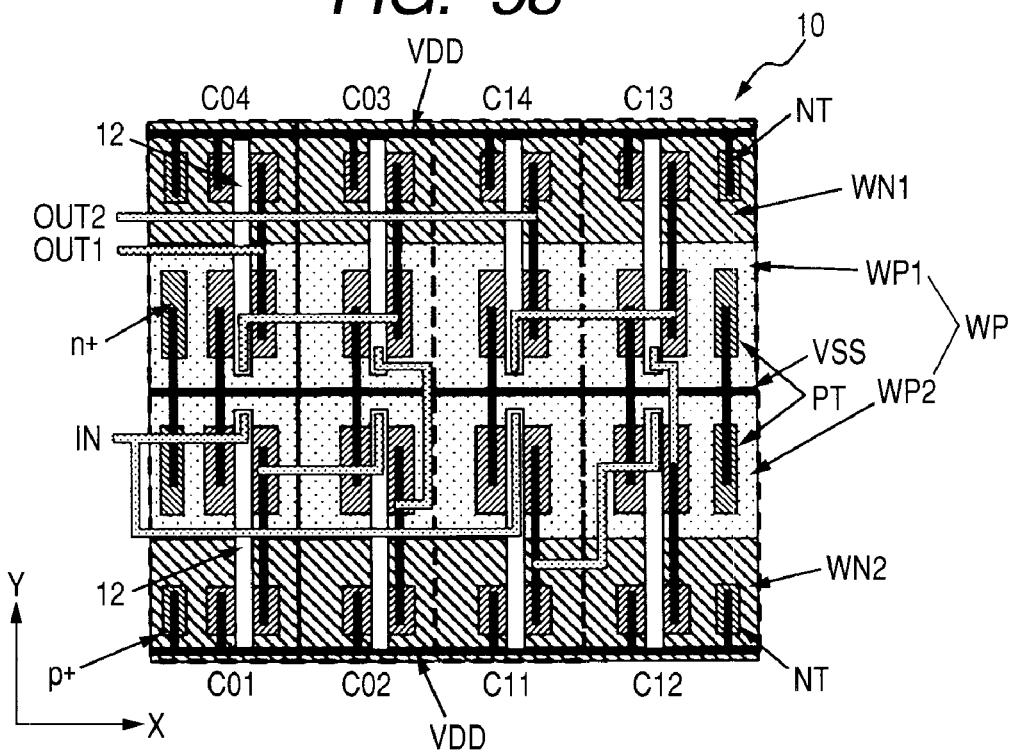
FIG. 58 is a plan view showing another layout example of the semiconductor integrated circuit according to the present invention.
Figure 59:
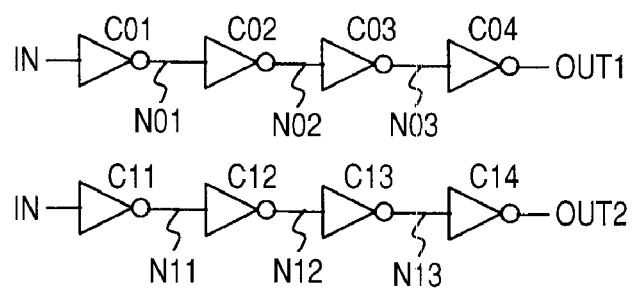
FIG. 59 is an equivalent circuit diagram of the semiconductor integrated circuit shown in FIG. 58.
Figure 60:
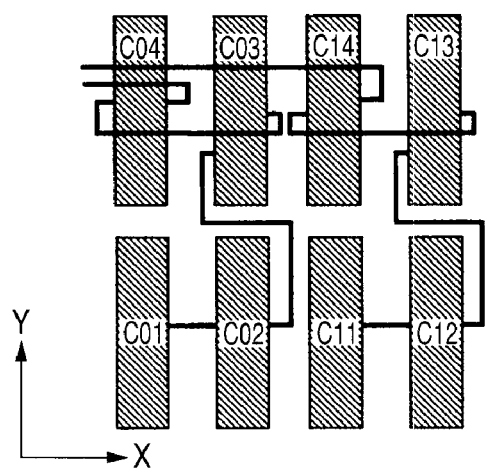
FIG. 60 is a schematic explanatory diagram of a layout state in the semiconductor integrated circuit illustrated in FIG. 58.

FIG. 58 shows another layout example of the semiconductor integrated circuit 10 according to the invention. FIG. 59 shows an equivalent circuit of the semiconductor integrated circuit 10 illustrated in FIG. 58. FIG. 60 schematically shows a layout state of cells in the semiconductor integrated circuit 10 illustrated in FIG. 58.

The semiconductor integrated circuit 10 shown in FIG. 58 largely differs from that shown in FIG. 12C with respect to the point that a plurality of cells are disposed so that a signal is transmitted in a counterclockwise direction.

Specifically, in the embodiment, by disposing a plurality of inverters so that each of the signal transmission direction in the inverters C01, C02, C03, and C04 and the signal transmission direction in the inverters C11, C12, C13, and C14 becomes the counterclockwise direction, a block of inverter chains is constructed.

Also in the embodiment, output signals of circuits on the left, right, top and bottom of a target circuit (inverter in the embodiment) are complementary with an output signal of the target circuit. Therefore, the well noise is reduced.

In FIG. 58, IN indicates an input signal, and OUT1 and OUT2 express output signals. In the case where an input terminal and an output terminal are disposed on the left side of a layout block, by disposing inverters so that the signal transmission direction becomes the counterclockwise direction as in the embodiment, the line length of an output signal can be shortened. An effect that a signal delay can be reduced is produced. Also in the case, a circuit of an output signal complementary with an output signal of the target circuit is disposed adjacent to the target circuit. Thus, well noises occurring in the inverters can be reduced.

Although an inverter is taken as an example in the embodiment, also in the case of replacing the inverter with another circuit whose output is complementary, similar effects can be obtained.

The present invention achieved by the inventors herein has been described concretely. Obviously, however, the invention is not limited to the embodiments but can be variously changed without departing from the gist.

What is claimed is:

1. A semiconductor integrated circuit comprising:
   a first logic circuit including a first transistor and a first output node;
   a first impurity region of the first transistor coupled to the first output node;

a second logic circuit including a second transistor and a second output node, the second logic circuit being disposed adjacent to the first logic circuit along the Y axis;

a second impurity region of the second transistor coupled to the second output node;

a third logic circuit including a third transistor and a third output node, the third logic circuit being disposed adjacent to the second logic circuit along the X axis orthogonal to the Y axis;

a third impurity region of the third transistor coupled to the third output node;

a fourth logic circuit including a fourth transistor and a fourth output node, the fourth logic circuit being disposed adjacent to the third logic circuit along the Y axis and disposed adjacent to the first logic circuit along the X axis; and a fourth impurity region of the fourth transistor coupled to the fourth output node, wherein a first output signal is transmitted from the first output node to the second logic circuit, wherein a second output signal is transmitted from the second output node to the third logic circuit, wherein a third output signal is transmitted from the third output node to the fourth logic circuit, wherein a fourth output signal is transmitted from the fourth output node, wherein the first to fourth transistors share a well, wherein the first output signal and the second output signal have phases opposite to each other, wherein the second output signal and the third output signal have phases opposite to each other, and wherein the third output signal and the fourth output signal of the fourth transistor have phases opposite to each other.

2. The semiconductor integrated circuit according to claim 1, further comprising feed taps for feeding power to the well, formed by an active region in the surface of a well of the same conduction type as that of the well, wherein feed taps are disposed every plural transistors so as to surround the plural transistors.

3. The semiconductor integrated circuit according to claim 1, wherein a plurality of logic circuit groups each including the first, second, third, and fourth logic circuits are disposed along the X axis.

4. The semiconductor integrated circuit according to claim 3, further comprising feed taps for feeding power to the well, formed by an active region in the surface of a well of the same conduction type as that of the well, wherein feed taps are disposed in a border of the plurality of logic circuit groups.

5. The semiconductor integrated circuit according to claim 3, wherein logic circuits belonging to different logic circuit groups are disposed adjacent to each other along the X axis or the Y axis.

6. The semiconductor integrated circuit according to claim 3, wherein each of the first, third, and fourth logic circuits is an inverter for inverting logic of an input signal and outputting the resultant signal, and wherein the second logic circuit is a NOR gate for obtaining NOR logic of an input signal.

7. The semiconductor integrated circuit according to claim 3, wherein each of the first, third, and fourth logic circuits is an inverter for inverting logic of an input signal and outputting the resultant signal, and wherein the second logic circuit is a NAND gate for obtaining NAND logic of an input signal.

8. The semiconductor integrated circuit according to claim 7, wherein a logic circuit for outputting a signal having a relation of a correlation level with an output signal of the fourth logic circuit is disposed adjacent to the fourth logic circuit.

9. The semiconductor integrated circuit according to claim 3, wherein each of the first and second logic circuits is an inverter for inverting logic of an input signal and outputting the resultant signal, wherein the third logic circuit is a NAND gate for obtaining NAND logic of an input signal, wherein the fourth logic circuit is a NOR gate for obtaining NOR logic of an input signal, wherein fifth and sixth logic circuits are disposed adjacent to the fourth logic circuit along the Y axis, wherein the sixth logic circuit is disposed adjacent to the fifth logic circuit along the X axis, and wherein an output signal of the fifth logic circuit and an output signal of the sixth logic circuit have phases opposite to each other.

10. The semiconductor integrated circuit according to claim 1, wherein each of the first, second, third, and fourth logic circuits is an inverter including a p-channel-type MOS transistor and an n-channel-type MOS transistor coupled in series with the p-channel-type MOS transistor.

11. The semiconductor integrated circuit according to claim 1, wherein a signal input to the first and third logic circuits and a signal input to the second and fourth logic circuits are at a complementary level.

12. The semiconductor integrated circuit according to claim 1, wherein a plurality of logic circuits including the first, second, third, and fourth logic circuits are coupled in a loop shape, thereby forming a ring oscillator.

* * * * *